(12) United States Patent
Masunaga et al.

(10) Patent No.: US 9,244,348 B2
(45) Date of Patent: Jan. 26, 2016

(54) CHEMICALLY AMPLIFIED NEGATIVE RESIST COMPOSITION AND PATTERN FORMING PROCESS

(75) Inventors: Keiichi Masunaga, Joetsu (JP); Satoshi Watanabe, Joetsu (JP); Yoshio Kawai, Joetsu (JP); Luisa Bozano, San Jose, CA (US); Ratnam Sooriyakumaran, San Jose, CA (US)

(73) Assignees: SHIN-ETSU CHEMICAL CO., LTD., Tokyo (JP); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/371,999

(22) Filed: Feb. 13, 2012

(65) Prior Publication Data

US 2013/0209922 A1    Aug. 15, 2013

(51) Int. Cl.
G03F 7/004    (2006.01)
G03F 7/038    (2006.01)

(52) U.S. Cl.
CPC .................................. G03F 7/0382 (2013.01)

(58) Field of Classification Search
None
See application file for complete search history.

(56) References Cited

U.S. PATENT DOCUMENTS

| | | | |
|---|---|---|---|
| 5,286,600 A | 2/1994 | Ochiai et al. | |
| 5,668,226 A | 9/1997 | Furihata et al. | |
| 6,794,113 B2 | 9/2004 | Nozaki et al. | |
| 7,300,739 B2 | 11/2007 | Allen et al. | |
| 7,393,624 B2 | 7/2008 | Allen et al. | |
| 7,563,558 B2 | 7/2009 | Allen et al. | |
| 7,977,027 B2 | 7/2011 | Takeda et al. | |
| 2004/0023151 A1* | 2/2004 | Takeda et al. | 430/270.1 |
| 2008/0020290 A1* | 1/2008 | Hatakeyama et al. | 430/4 |
| 2010/0009299 A1* | 1/2010 | Watanabe et al. | 430/326 |
| 2010/0129738 A1* | 5/2010 | Takemura et al. | 430/5 |
| 2010/0143830 A1* | 6/2010 | Ohashi et al. | 430/5 |
| 2010/0261101 A1* | 10/2010 | Yoshikawa et al. | 430/5 |
| 2010/0291484 A1* | 11/2010 | Tanaka et al. | 430/285.1 |
| 2010/0304301 A1 | 12/2010 | Tanaka et al. | |
| 2011/0177464 A1 | 7/2011 | Takeda et al. | |
| 2011/0294047 A1 | 12/2011 | Koitabashi et al. | |

FOREIGN PATENT DOCUMENTS

| | | |
|---|---|---|
| EP | 2048541 A1 | 4/2009 |
| EP | 2253996 A1 | 11/2010 |
| JP | 5-232702 A | 9/1993 |
| JP | 8-202037 A | 8/1996 |
| JP | 2001-154357 A | 6/2001 |
| JP | 2001-226430 A | 8/2001 |
| JP | 2003-337414 A | 11/2003 |
| JP | 2008-102383 A | 5/2008 |
| JP | 2008-249762 A | 10/2008 |
| JP | 2008-249951 A | 10/2008 |
| JP | 2008-304590 A | 12/2008 |
| JP | 2010-164933 A | 7/2010 |
| JP | 2010-276910 A | 12/2010 |

OTHER PUBLICATIONS

Ito et al., "Negative Resist Composition", IBM Technical Disclosure Bulletin, vol. 35, No. 1B, pp. 397, Jun. 1992.
Itoh et al., "Acid-Catalyzed Dehydration", American Chemical Society, Symposium Series 537, Chapter 5, pp. 64-87, 1994.
Yoshida et al., "Cationic chemistry and chemically amplified resist materials for microlithography: synthesis and applications of copolymers of 4-(1-hydroxy-11methylethyl) styrene and styrene or 4-hydroxystyrene", Polymer Papers, vol. 35, No. 1, pp. 5-13, 1994.
Extended European Search Report for European Application No. 13154792.9, dated Jun. 28, 2013.

* cited by examiner

*Primary Examiner* — Cynthia H Kelly
*Assistant Examiner* — Alyssa L Cepluch
(74) *Attorney, Agent, or Firm* — Birch, Stewart, Kolasch & Birch, LLP

(57) ABSTRACT

A polymer comprising recurring units having an acid-eliminatable group on a side chain and aromatic ring-bearing cyclic olefin units is used to formulate a chemically amplified negative resist composition. Any size shift between the irradiated pattern and the formed resist which can arise in forming a pattern including isolated feature and isolated space portions is reduced, and a high resolution is obtained.

5 Claims, No Drawings

US 9,244,348 B2

CHEMICALLY AMPLIFIED NEGATIVE RESIST COMPOSITION AND PATTERN FORMING PROCESS

TECHNICAL FIELD

This invention relates to a chemically amplified negative resist composition comprising a polymer having a polarity changing function, best suited for the microfabrication of semiconductor substrates and photomask substrates, and a pattern forming process using the composition.

BACKGROUND ART

As is well known in the art, it is required to reduce the pattern rule so as to comply with the recent demand for higher integration densities and operating speeds in LSI devices. Accordingly the exposure method and resist composition have noticeably changed. Particularly in the lithography process of forming patterns with a feature size of 0.2 µm or less, the exposure light is switched to KrF or ArF excimer laser radiation or electron beam, and the photoresist material is changed to a chemically amplified resist material having a good sensitivity to such high-energy radiation and a high resolution.

Resist compositions include positive compositions wherein the exposed area is dissolved and negative compositions wherein the exposed area is left as a pattern. Either one is selected in accordance with the desired resist pattern, depending on ease of processing. The chemically amplified negative resist composition generally comprises a polymer which is soluble in aqueous alkaline developer, an acid generator which is decomposed to generate an acid upon exposure to radiation, and a crosslinker which forms crosslinks between polymer molecules under the catalysis of the acid to turn the polymer insoluble in the developer (sometimes, the polymer and the crosslinker are integrated together). Further a basic compound for controlling diffusion of the acid generated upon exposure is added.

Among negative resist compositions comprising the polymer which is soluble in aqueous alkaline developer, a number of negative resist compositions based on polymers using phenol units as the alkali-soluble unit were developed as best suited for the KrF excimer laser lithography. These compositions were not used in the ArF excimer laser lithography because phenol units have little or no transmittance to exposure light having a wavelength of 150 to 220 nm. Recently a highlight is drawn to these compositions again as the negative resist for the EB or EUV lithography capable of forming finer size patterns. For example, Patent Documents 1 to 3 disclose resist compositions which exhibit a very high resolution even when used in thin film form.

Beside the above-mentioned compositions, many other chemically amplified negative resist compositions have been developed. These negative working resist compositions use a crosslinker for insolubilizing the alkali-soluble polymer under the action of an acid generated upon exposure to high-energy radiation. Many crosslinkers including those disclosed in Patent Documents 1 to 3 have been developed. On the other hand, an attempt has been made to endow the polymer with the function of crosslinker. For example, it was proposed to introduce styrene units having an alkoxymethoxy group substituted thereon (Patent Document 4), recurring units having an alkoxymethylamino group (Patent Document 5), recurring units having an epoxy group (Patent Document 6), recurring units of styrene having an acid-eliminatable hydroxyl group (Patent Document 7), recurring units of adamantyl having an acid-eliminatable hydroxyl group (Patent Document 8), and recurring units of aliphatic alkyl and cycloaliphatic hydrocarbon having an acid-eliminatable hydroxyl group (Patent Documents 9, 10 and 11), and materials which have an acid-eliminatable hydroxyl group (Non-Patent Documents 1, 2 and 3).

CITATION LIST

Patent Document 1: JP-A 2010-276910
Patent Document 2: JP-A 2010-164933
Patent Document 3: JP-A 2008-249762
Patent Document 4: JP-A H05-232702
Patent Document 5: JP-A H08-202037
Patent Document 6: JP-A 2001-226430
Patent Document 7: JP-A 2003-337414
Patent Document 8: JP-A 2001-154357
Patent Document 9: U.S. Pat. No. 7,300,739
Patent Document 10: U.S. Pat. No. 7,393,624
Patent Document 11: U.S. Pat. No. 7,563,558
Patent Document 12: JP-A 2008-102383
Patent Document 13: JP-A 2008-304590
Non-Patent Document 1: H. Ito, and R. Sooriyakumaran, IBM Technical Disclosure Bulletin Vol. 35, No. 1B, 397 (1992)
Non-Patent Document 2: H. Ito, Y. Maekawa, R. Sooriyakumaran, and E. A. Mash, ACS Symposium Series 537, Chapter 5, pp 64-87, (1994)
Non-Patent Document 3:M. Yoshida, and J. M. J. Frechet, Polymer, 35 (1), 5 (1994)

DISCLOSURE OF INVENTION

It is well known that when a resist pattern including both an isolated pattern portion having a feature isolated between wide spaces and an isolated space portion having a space isolated between wide features is formed by lithography using excimer laser radiation, a substantial difference is introduced between the circuit pattern drawn on the mask and the actually formed resist pattern due to light diffraction. Complete solution of this problem is one of most difficult tasks.

It is desirable to form a pattern having a narrow line width of less than 60 nm using a resist film with a thickness of 100 nm or less. In an attempt to form such a resist pattern by using a resist film which is developed for the EB lithography as disclosed in Patent Documents 1 to 3 and patternwise irradiating EB, the inventors found that the pattern formation by EB irradiation also invites shifts from the design size between the isolated pattern and isolated space portions.

Even when such size shifts occur, the desired resist pattern may be obtained by correcting the pattern of EB irradiation. However, addition of many corrections to the pattern of EB irradiation makes the pattern design complex and difficult.

An object of the invention is to provide a chemically amplified negative resist composition which establishes a high resolution corresponding to a line width of 60 nm or less, and reduces the shift between the irradiated pattern and the formed resist size which can arise in forming a pattern including isolated feature and isolated space portions, even when using high-energy radiation like EB or EUV, and a pattern forming process using the composition.

To solve the outstanding problem, the inventors repeated trial-and-error experiments for improving a resist composition comprising a copolymer of an aromatic ring-bearing cyclic olefin as proposed in Patent Documents 1 to 3 and exhibiting a high resolution.

A resist composition using a polymer consisting of recurring units of styrene containing an acid-eliminatable hydroxyl group as proposed in Patent Document 7 fails to exhibit a resolution which is as high as that of a resist composition comprising an ordinary polymer consisting of styrene units in combination with a crosslinker. Quite unexpectedly, the inventors have found that when a recurring structure having an acid-eliminatable group on a side chain is used as the insolubilizing unit in a copolymer of an aromatic ring-bearing cyclic olefin, the shift between the irradiated pattern and the formed resist size which can arise in forming a pattern including isolated feature and isolated space portions is reduced, and a resolution and LER are superior to that of a resist composition comprising a polymer free of units having an acid-eliminatable group on a side chain and a crosslinker is obtained. The invention is predicated on this finding.

In one aspect, the invention provides a chemically amplified negative resist composition comprising a resist polymer having a leaving group and an acid generator, adapted such that the resist polymer turns insoluble in alkaline developer as a result of the leaving group undergoing an elimination reaction under the catalysis of an acid generated by the acid generator upon exposure to high-energy radiation. The resist polymer comprises recurring units having formula (1), recurring units of at least one type selected from formulae (2) and (3), and recurring units of at least one type selected from formulae (4) and (5), wherein at least one of the recurring units other than the recurring units having formula (1) has at least one phenolic hydroxyl group and/or fluoroalcohol group, and the total of the recurring units other than the recurring units having formula (1) accounts for 25 to 95 mol % based on the overall recurring units of the polymer,

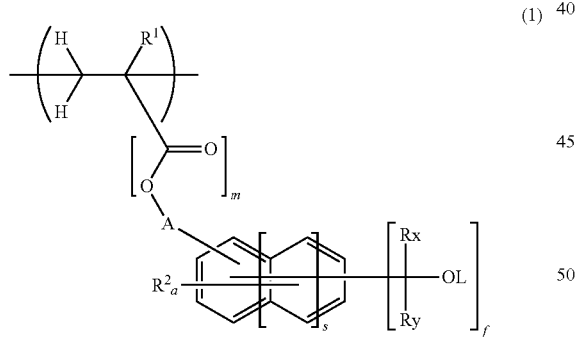

(1)

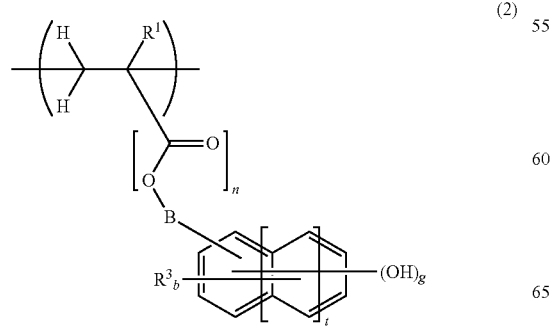

(2)

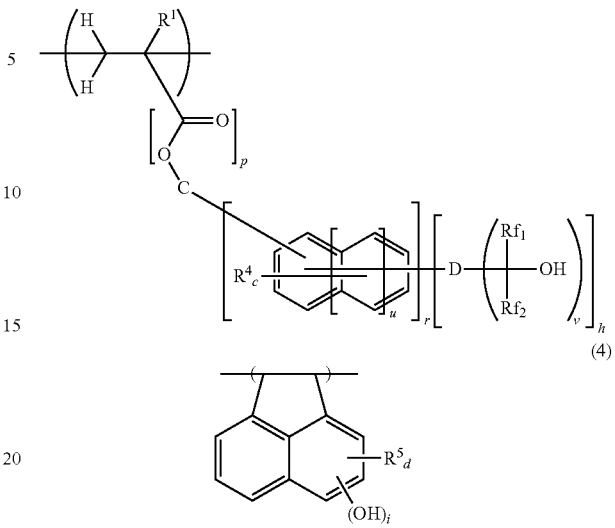

(3)

(4)

(5)

Herein A, B, and C each are a single bond, or a $C_1$-$C_{10}$ alkylene group which may contain an ethereal oxygen atom at an intermediate of the chain, D is a single bond or a divalent, straight, branched or cyclic, aliphatic $C_1$-$C_{10}$ hydrocarbon group which may be substituted with fluorine and which may contain an ethereal oxygen atom, carbonyl group or carbonyloxy group at an intermediate of the chain, $R^1$ is hydrogen, fluorine, methyl, or trifluoromethyl, $R^2$, $R^3$, $R^4$, $R^5$, and $R^6$ are each independently hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group, L is hydrogen, a monovalent, straight, branched or cyclic, aliphatic $C_1$-$C_{10}$ hydrocarbon group which may contain an ethereal oxygen atom, carbonyl group or carbonyloxy group at an intermediate of the chain, or an optionally substituted monovalent aromatic group, Rx and Ry each are hydrogen or a $C_1$-$C_{15}$ alkyl group which may be substituted with hydroxy or alkoxy, Rx and Ry may bond together to form a ring with the carbon atom to which they are attached, excluding the case where Rx and Ry are hydrogen at the same time, $Rf_1$ and $Rf_2$ each are a $C_1$-$C_6$ alkyl group having at least one fluorine atom, $Rf_1$ may bond with D to form a ring with the carbon atom to which they are attached, f is an integer of 1 to 3, g is an integer of 0 to 3, h is 1 or 2, i and j each are an integer of 0 to 3, r is 0 or 1, v is 1 or 2, s, t and u each are an integer of 0 to 2, a is an integer (5+2s−f), b is an integer (5+2t−g), c is an integer (5+2u−h), d is an integer of 0 to 5, e is an integer of 0 to 3, m, n and p are each independently 0 or 1, with the proviso that p is 1 when r is 0.

In detail, the resist polymer preferably comprises recurring units having formula (6), (7) and (8).

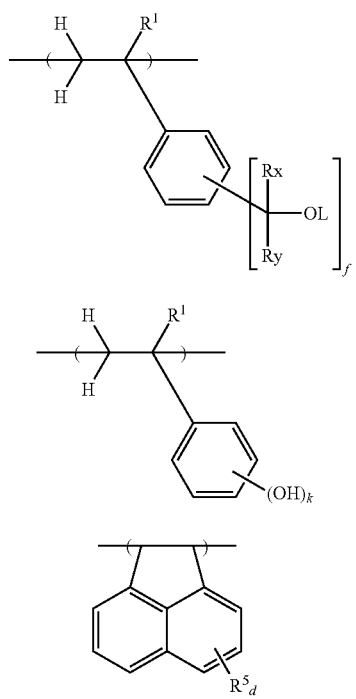

Herein R¹ is hydrogen, fluorine, methyl, or trifluoromethyl,
R⁵ is hydrogen, halogen, an optionally halo-substituted, straight, branched or cyclic $C_2$-$C_8$ acyloxy group, an optionally halo-substituted, straight, branched or cyclic $C_1$-$C_8$ alkyl group, or an optionally halo-substituted, straight, branched or cyclic $C_1$-$C_8$ alkoxy group,
L is hydrogen, a monovalent, straight, branched or cyclic, aliphatic $C_1$-$C_{10}$ hydrocarbon group which may contain an ethereal oxygen atom, carbonyl group or carbonyloxy group at an intermediate of the chain, or an optionally substituted monovalent aromatic group,
Rx and Ry each are hydrogen or a $C_1$-$C_{15}$ alkyl group which may be substituted with hydroxy or alkoxy, Rx and Ry may bond together to form a ring with the carbon atom to which they are attached, excluding the case where Rx and Ry are hydrogen at the same time, and
f is an integer of 1 to 3, k is an integer of 1 to 3, and d is an integer of 0 to 5.

Preferably, R¹ of formula (6) is hydrogen, R¹ of formula (7) is hydrogen, L is hydrogen, Rx and Ry are independently selected from the group consisting of straight and branched alkyl groups, especially $CH_3$, f is 1, k is 1, and d is 0. Typically, the resist polymer comprises the following recurring units:

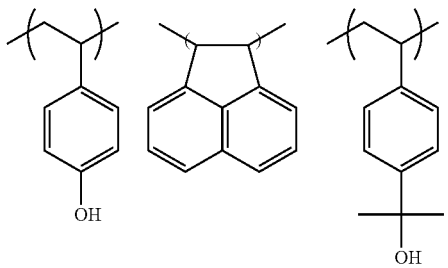

Also contemplated herein is a photomask blank having the resist composition coated thereon.

In another aspect, the invention provides a process for forming a resist pattern, comprising the steps of applying the chemically amplified negative resist composition defined above onto a processable substrate to form a resist film thereon, exposing patternwise the resist film to high-energy radiation, and developing the exposed resist film with an alkaline developer to form a resist pattern.

The high-energy radiation is typically EUV or electron beam. The processable substrate is typically a photomask blank. The photomask blank preferably has an outermost surface formed of a chromium based material.

Advantageous Effects of Invention

When a resist film of up to 100 nm thick formed from the resist composition is exposed to a pattern of EB or EUV including both isolated feature and isolated space portions, the resist composition is successful in fully suppressing the size shift between the irradiated pattern and the formed pattern and establishing a high resolution at the same time.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The acronym "PAG" stands for photoacid generator, "PEB" for post-exposure bake, "LER" for line edge roughness, and "DOF" for depth of focus.

The term "high-energy radiation" is intended to encompass ultraviolet (UV) radiation, deep UV, extreme ultraviolet (EUV), electron beam (EB), x-ray, excimer laser, γ-ray and synchrotron radiation.

The resist composition of the invention is described in detail which has the advantage that when a resist film of the composition is exposed to a pattern of EB or EUV including both isolated feature and isolated space portions, the composition is successful in fully suppressing the size shift between the irradiated pattern and the formed pattern and establishing a high resolution at the same time.

The chemically amplified negative resist composition comprises a resist polymer and an acid generator. The resist polymer is adapted such that the resist polymer may turn insoluble in alkaline developer as a result of hydroxyl groups in the resist polymer undergoing elimination reaction under the catalysis of an acid generated by the acid generator upon exposure to high-energy radiation. The resist polymer is a polymer comprising recurring units having formula (1), recurring units of at least one type selected from formulae (2) and (3), and recurring units of at least one type selected from formulae (4) and (5), wherein at least one of the recurring units other than the recurring units having formula (1) has at least one phenolic hydroxyl group and/or fluoroalcohol group, and the total of the recurring units other than the recurring units having formula (1) accounts for 25 to 95 mol % based on the overall recurring units of the polymer.

In the present invention, the recurring units having a phenolic hydroxyl group include the recurring units of formula (2), the recurring units of formula (4), and the recurring units of formula (5). The recurring units having a fluoroalcohol group include the recurring units of formula (3).

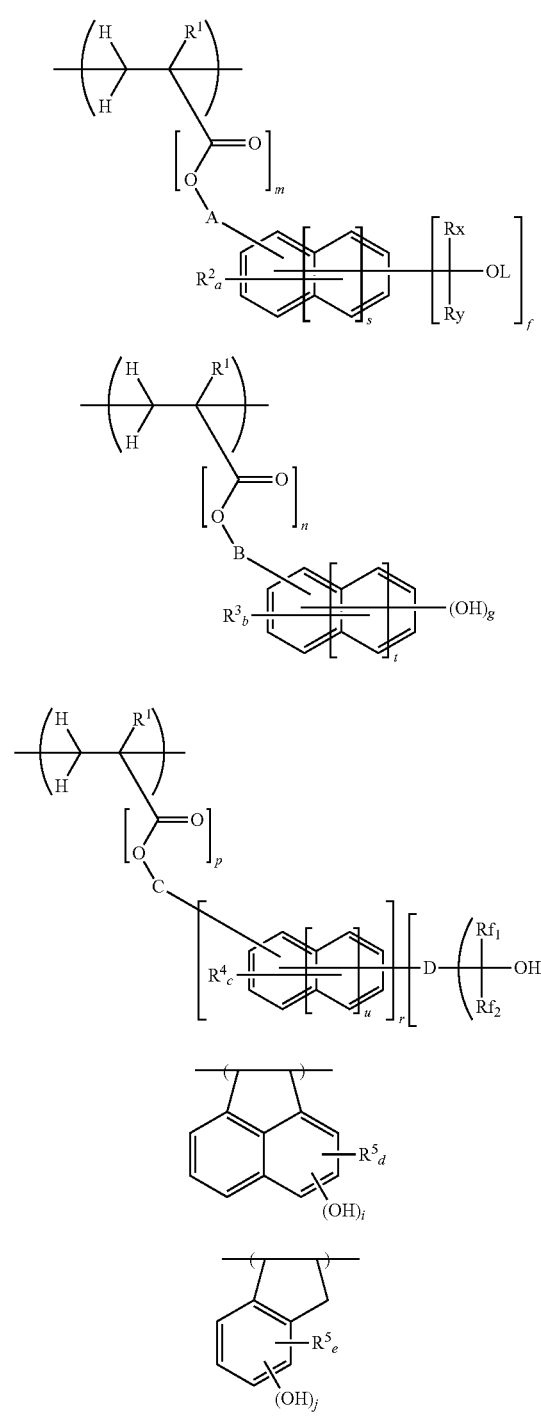

Herein A, B, and C each are a single bond, or a $C_1$-$C_{10}$ alkylene group which may contain an ethereal oxygen atom at an intermediate of the chain, D is a single bond or a divalent, straight, branched or cyclic, aliphatic $C_1$-$C_{10}$ hydrocarbon group which may be substituted with fluorine and which may contain an ethereal oxygen atom, carbonyl group or carbonyloxy group at an intermediate of the chain. $R^1$ is hydrogen, fluorine, methyl, or trifluoromethyl. $R^2$, $R^3$, $R^4$, $R^5$, and $R^6$ are each independently hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_8$ alkoxy group. L is hydrogen, a monovalent, straight, branched or cyclic, aliphatic $C_1$-$C_{10}$ hydrocarbon group which may contain an ethereal oxygen atom, carbonyl group or carbonyloxy group at an intermediate of the chain, or an optionally substituted monovalent aromatic group. Rx and Ry each are hydrogen or a $C_1$-$C_{15}$ alkyl group which may be substituted with hydroxy or alkoxy, Rx and Ry may bond together to form a ring with the carbon atom to which they are attached, excluding the case where Rx and Ry are hydrogen at the same time. $Rf_1$ and $Rf_2$ each are a $C_1$-$C_8$ alkyl group having at least one fluorine atom, $Rf_1$ may bond with D to form a ring with the carbon atom to which they are attached. The subscript f is an integer of 1 to 3, g is an integer of 0 to 3, h is 1 or 2, i and j are an integer of 0 to 3, r is 0 or 1, v is 1 or 2, s, t and u each are an integer of 0 to 2, a is an integer (5+2s−f), b is an integer (5+2t−g), c is an integer (5+2u−h), d is an integer of 0 to 5, e is an integer of 0 to 3, m, n and p are each independently 0 or 1, with the proviso that p is 1 when r is 0.

The recurring unit of formula (1) included in the polymer performs in such a way that the OL may undergo elimination reaction under the catalysis of an acid generated by the acid generator upon exposure to high-energy radiation whereby the unit itself induces alkali insolubilization and crosslinking reaction between polymer molecules.

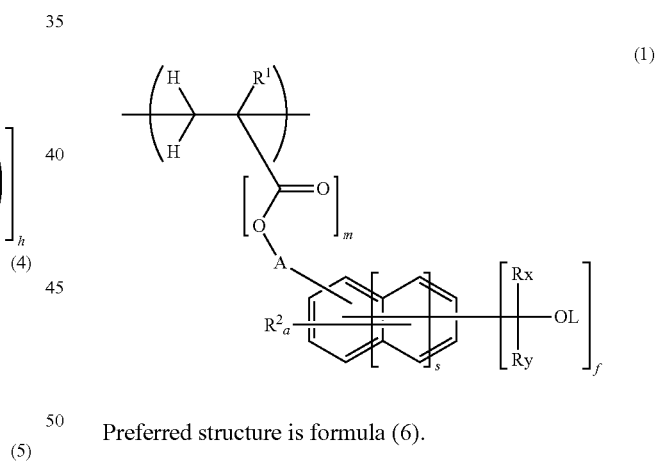

Preferred structure is formula (6).

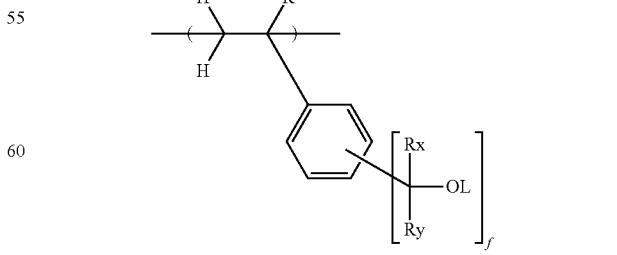

Herein $R^1$ is hydrogen, fluorine, methyl, or trifluoromethyl. $R^2$ is each independently hydrogen, halogen, an optionally halo-substituted, straight, branched or cyclic $C_2$-$C_8$ acyloxy group, an optionally halo-substituted, straight, branched or cyclic $C_1$-$C_6$ alkyl group, or an optionally halo-substituted, straight, branched or cyclic $C_1$-$C_6$ alkoxy group. If each substituent group has too high of a carbon count, the polymer may have too low of a solubility and the design for a high resolution be difficult. Preferred examples of the hydrocarbon moiety of the acyloxy, alkyl and alkoxy groups include methyl, ethyl, propyl, isopropyl, butyl, pentyl, hexyl, and structural isomers of carbon skeleton having a branched or cyclic structure. If the carbon count exceeds the range defined above, the solubility of a polymer in alkaline developer becomes undesirably lower.

The acid-eliminatable group (OL group)-bearing side chain substitutes on the aromatic ring, and f (indicative of the number of substitutions) ranges from 1 to 3. L is hydrogen, a monovalent, straight, branched or cyclic, aliphatic $C_1$-$C_{10}$ hydrocarbon group which may contain an ethereal oxygen atom, carbonyl group or carbonyloxy group at an intermediate of the chain, or an optionally substituted monovalent aromatic group. Preferred examples of L include hydrogen, methyl, ethyl, propyl, isopropyl, cyclopentyl, cyclohexyl, adamantyl, methylcarbonyl, and phenyl.

Rx and Ry each are hydrogen or a $C_1$-$C_{15}$ alkyl group which may be substituted with hydroxy or alkoxy, Rx and Ry may bond together to form a ring with the carbon atom to which they are attached, excluding the case where Rx and Ry are hydrogen at the same time. Preferred structures of Rx and Ry include methyl, ethyl, popyl, butyl, cyclopentyl, cyclohexyl, and structural isomers thereof, and the foregoing groups having a hydroxyl group substituted thereon. When Rx and Ry bond together to form a ring, the ring is typically a 5 or 6-membered aliphatic ring.

In formula (1), the aromatic ring may be bonded to the main chain via a single bond, via a carbonyloxy group or via a linker "A." The subscript s is an integer of 0 to 2. The structure represents a benzene ring when s=0, a naphthalene ring when s=1, or an anthracene ring when s=2.

"A" is a single bond, or a $C_1$-$C_{10}$ alkylene group which may contain an ethereal oxygen atom (or ether bond) at an intermediate of the chain. Preferred alkylene groups include methylene, ethylene, propylene, butylene, pentylene, hexylene, and structural isomers of carbon skeleton having a branched or cyclic structure. When an ethereal oxygen atom is contained, in case m=1 in formula (1), it may be at any position excluding between the α- and β-position carbons relative to the ester oxygen. In case m=0 in formula (1), the atom bonding to the main chain is an ethereal oxygen atom, and a second ethereal oxygen atom may be contained at any position excluding between the α- and β-position carbons relative to that ethereal oxygen. If the alkylene group has more than 10 carbon atoms, the solubility of a polymer in alkaline developer becomes undesirably lower.

The linker A is a divalent hydrocarbon group, typically a straight, branched or cyclic $C_1$-$C_{10}$ alkylene group, which may be substituted with an oxygen atom. Preferred examples of the linker are shown below as incorporated in exemplary structures of the unit of formula (1).

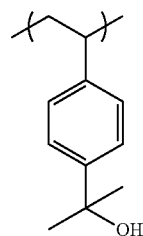 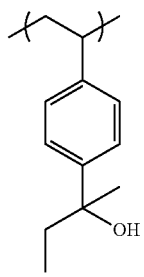

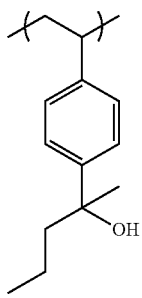 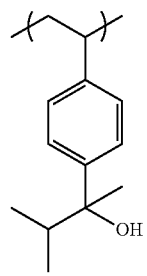

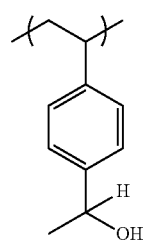 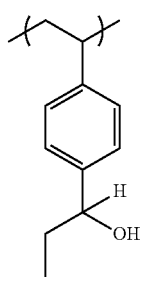

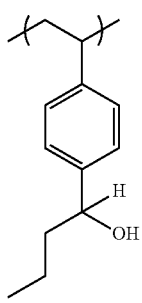 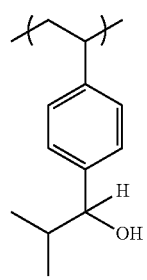

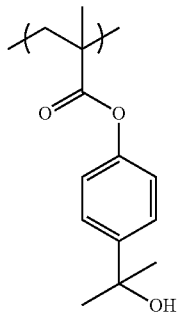 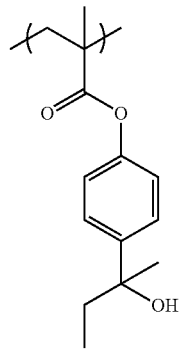

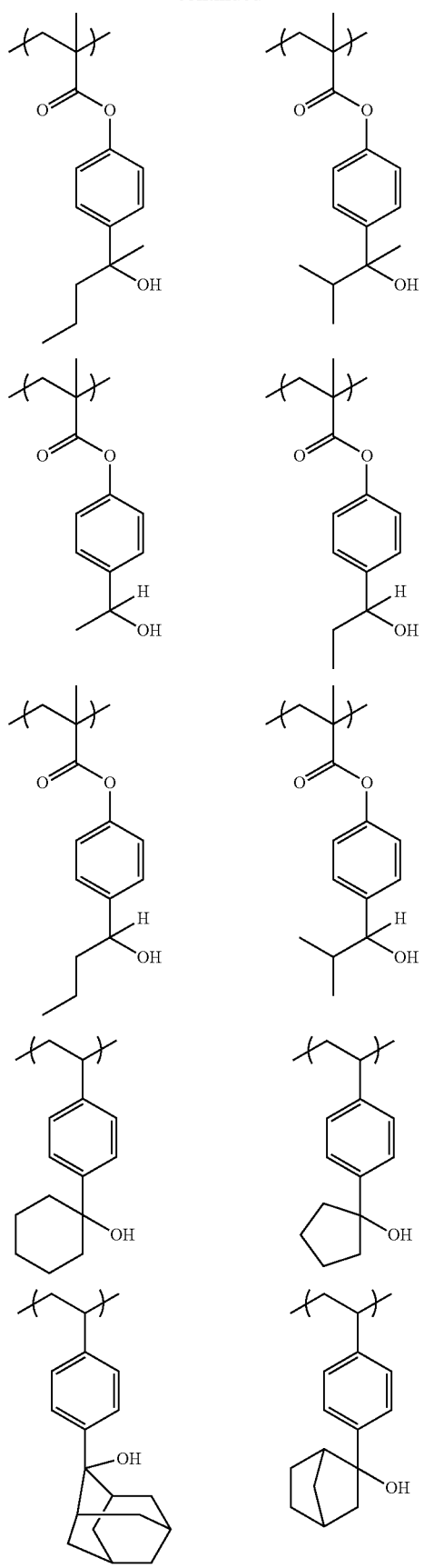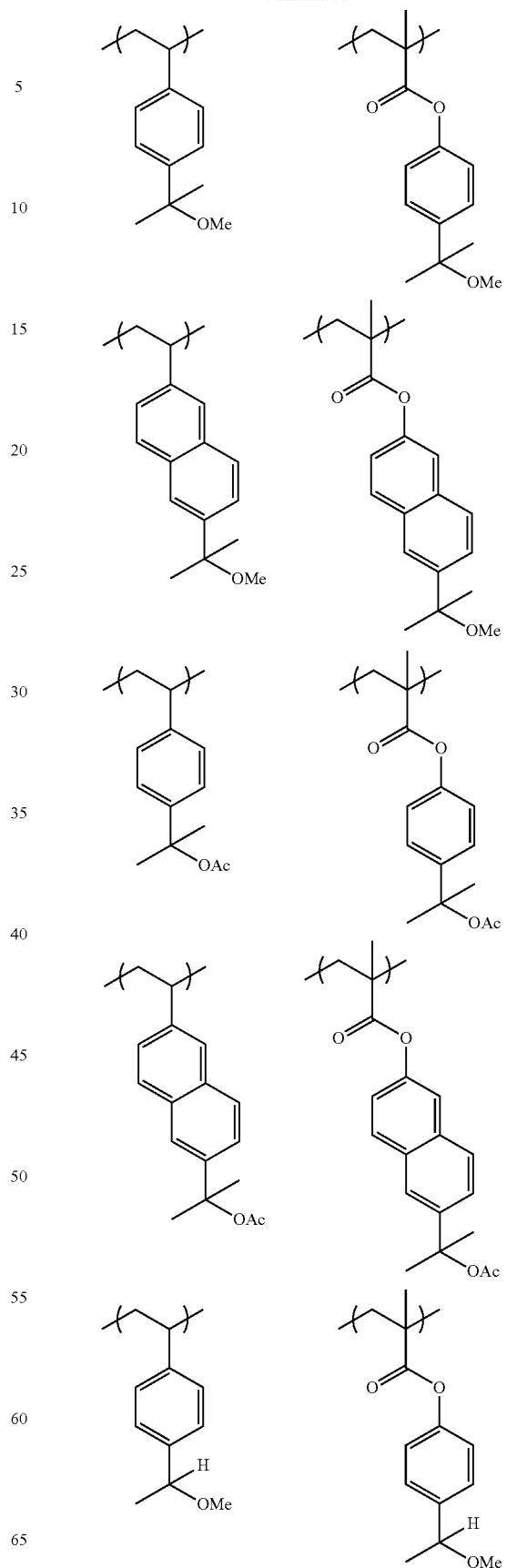

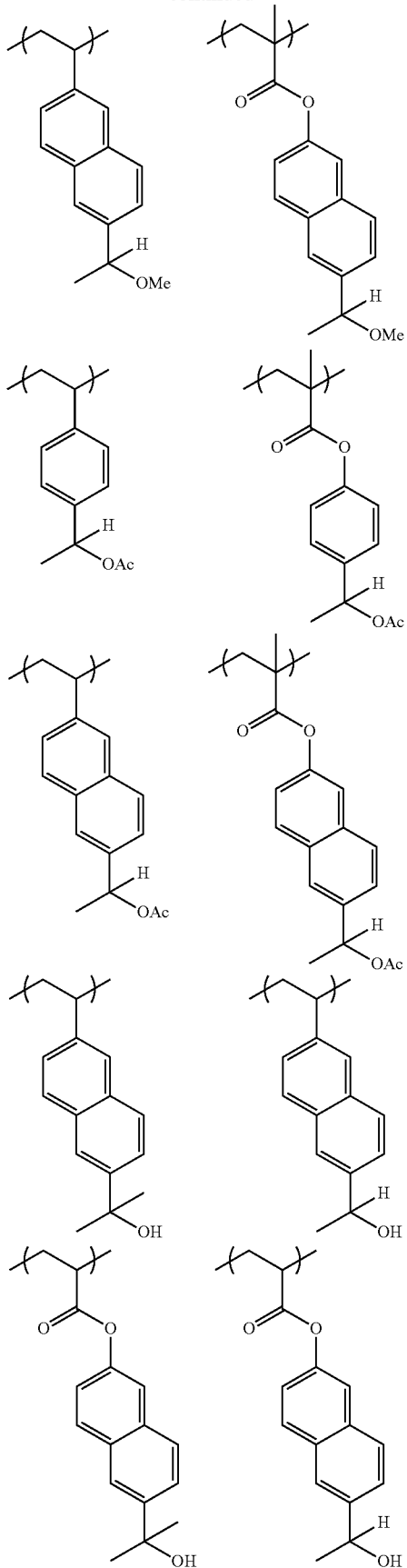

-continued
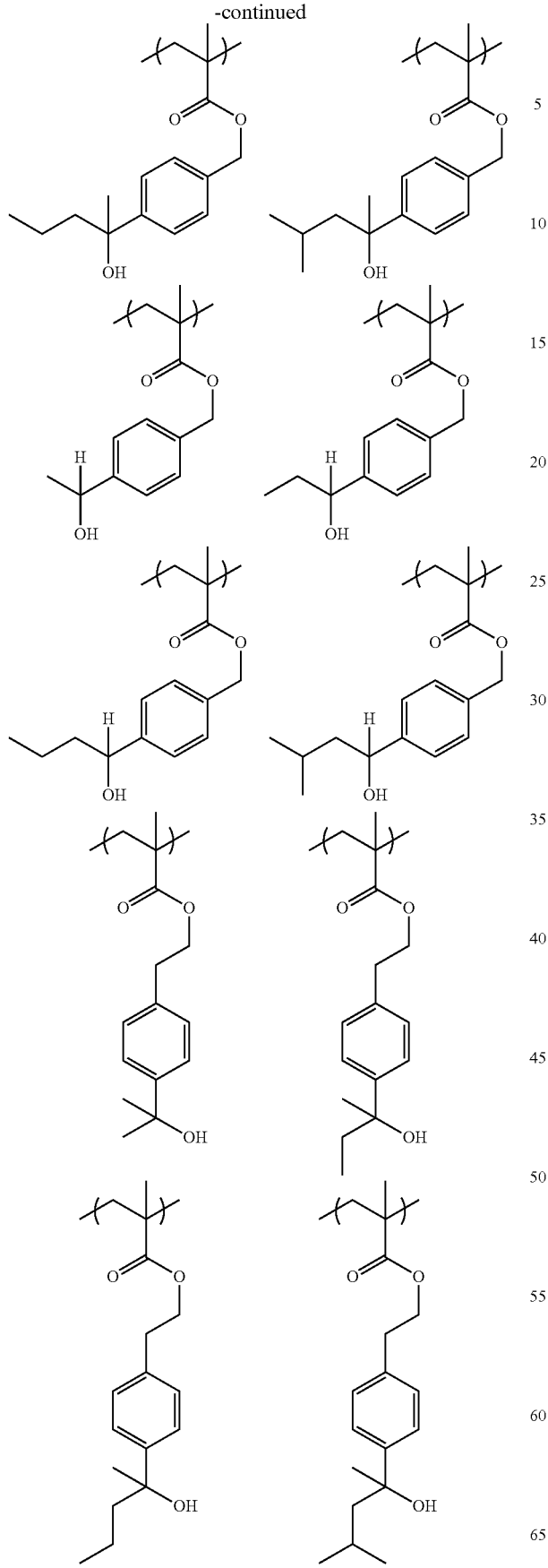
-continued
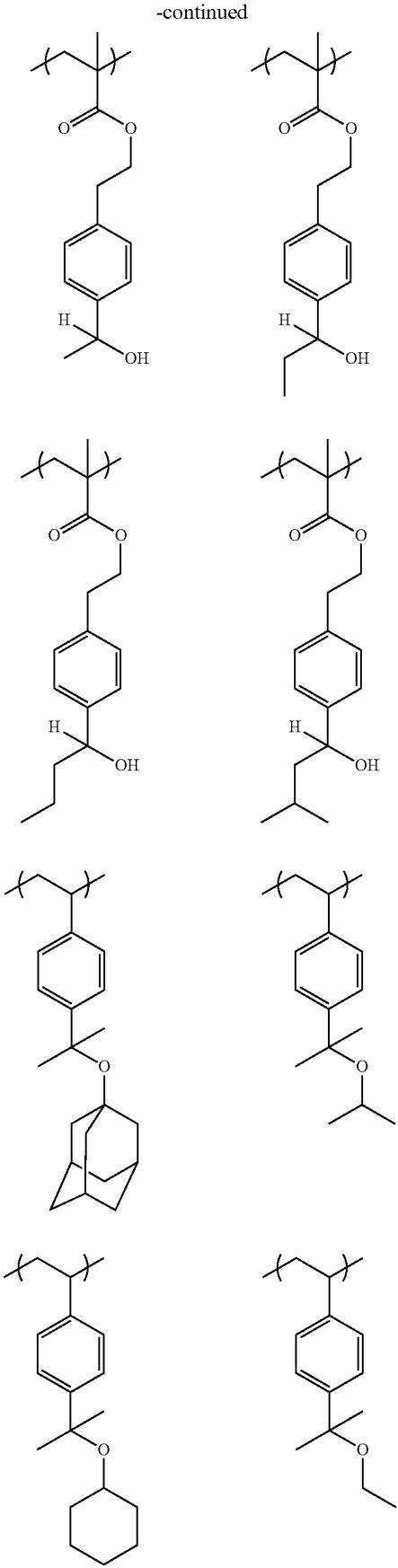

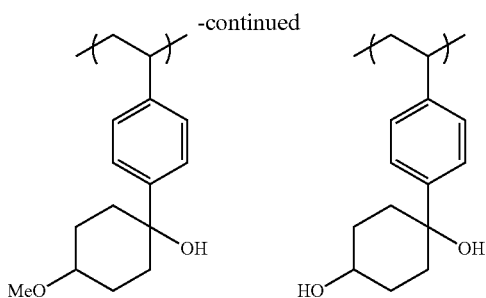

For the purpose of achieving a high resolution, the resist polymer in the resist composition further comprises recurring units having the general formula (2) and/or (3) as the unit that allows for appropriate thermal motion of the polymer so as to effectively promote the insolubilizing reaction associated with elimination of the acid-eliminatable group (OL group) in the recurring unit having formula (1).

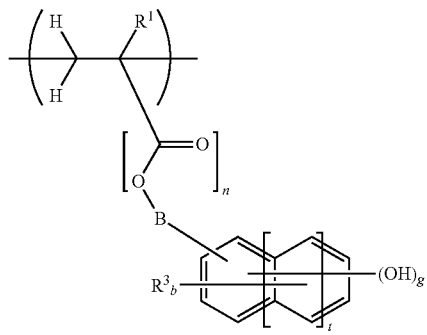

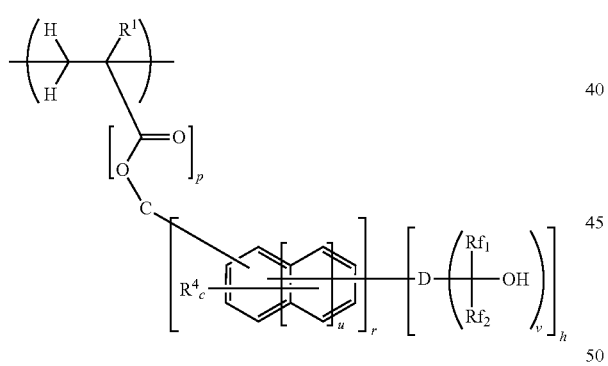

In formula (2), $R^1$ is as defined in formula (1). $R^3$ and b are as defined for $R^2$ and a in formula (1), respectively. Preferred examples of these groups are the same as enumerated above. The linker B is as defined for A in formula (1), and preferred examples thereof are the same as enumerated above.

In formula (2), g is indicative of the number of hydroxyl groups substituting on the aromatic ring ranges from 0 to 3. The resist polymer must comprise either recurring units having a phenolic hydroxyl group or recurring units having formula (3) for endowing the resist polymer with solubility in aqueous alkaline developer and substrate adhesion, as will be described later. Also, in order that the polymer achieve a high resolution by establishing a high activity to the insolubilizing reaction associated with elimination of the acid-eliminatable hydroxyl group in the recurring unit having formula (1), the resist polymer preferably comprises recurring units of formula (2) wherein g is at least 1, more preferably at least 50 mol % of recurring units of formula (2) wherein g is at least 1. Notably, the unit of formula (2) wherein g=0 may be used for adjusting the dissolution rate and for adjusting the degree of allowance for thermal vibration of the polymer although this unit may be omitted in a certain polymer design.

Like formula (1), the aromatic ring in the recurring unit may be bonded to the main chain via a single bond, via a carbonyloxy group or via a linker B. The subscript t is an integer of 0 to 2. The structure represents a benzene ring when t=0, a naphthalene ring when t=1, or an anthracene ring when t=2.

The recurring unit of formula (2) wherein g is at least 1, n is 0, and B is a single bond, that is, the aromatic ring is bonded directly to the polymer main chain (indicative of the absence of a linker), is a unit derived from a monomer in which an optionally 1-substituted vinyl group is bonded to a hydroxyl-substituted aromatic ring, typically a hydroxystyrene unit. Preferred examples of the monomer include 3-hydroxystyrene, 4-hydroxystyrene, 5-hydroxy-2-vinylnaphthalene, and 6-hydroxy-2-vinylnaphthalene. More preferred structure examples are 3-hydroxystyrene or 4-hydroxystyrene by formula (7).

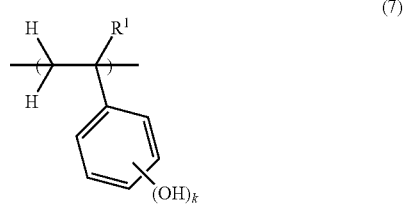

($R^1$ is as defined in formula (1), and k is an integer of 1 to 3.)

The recurring unit of formula (2) wherein n is 1, that is, having an ester structure as the linker is a unit of carbonyl-substituted vinyl monomer, typically (meth)acrylate. Of the recurring units of formula (2) having a linker (—CO—O—B—) derived from (meth)acrylates, those units wherein g is at least 1 are exemplified by the following examples.

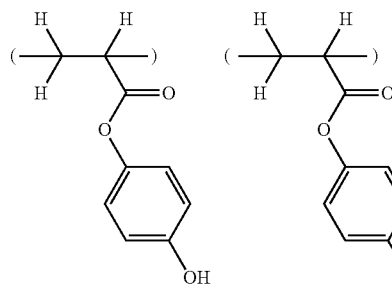

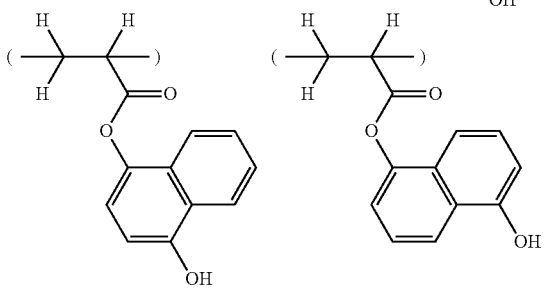

-continued

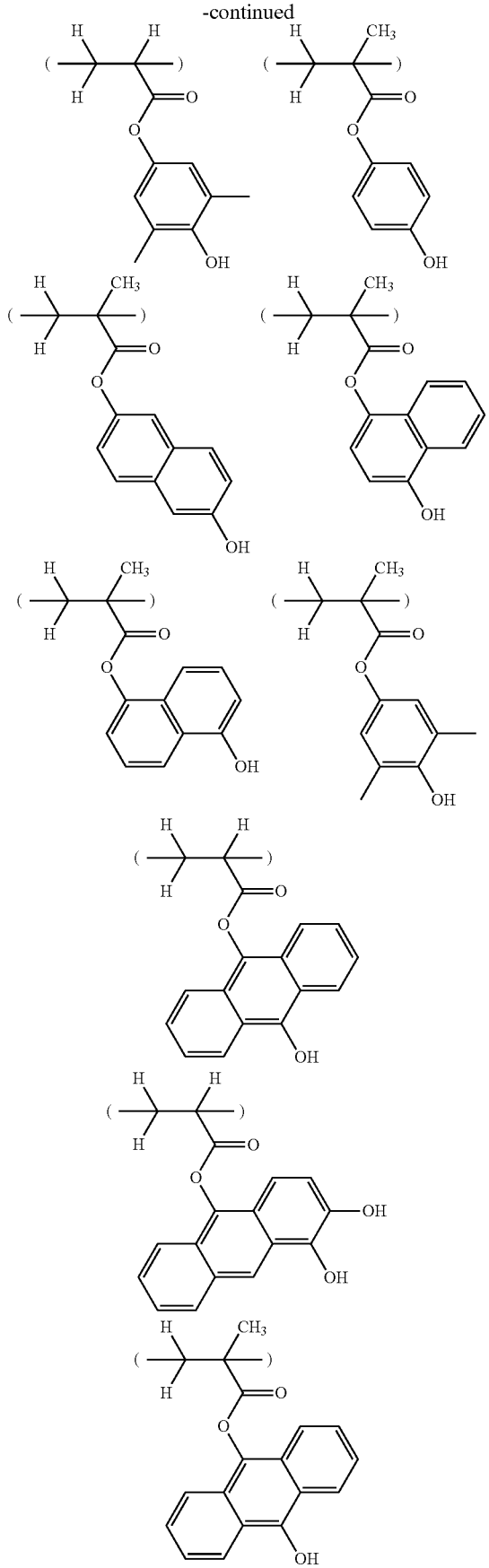

-continued

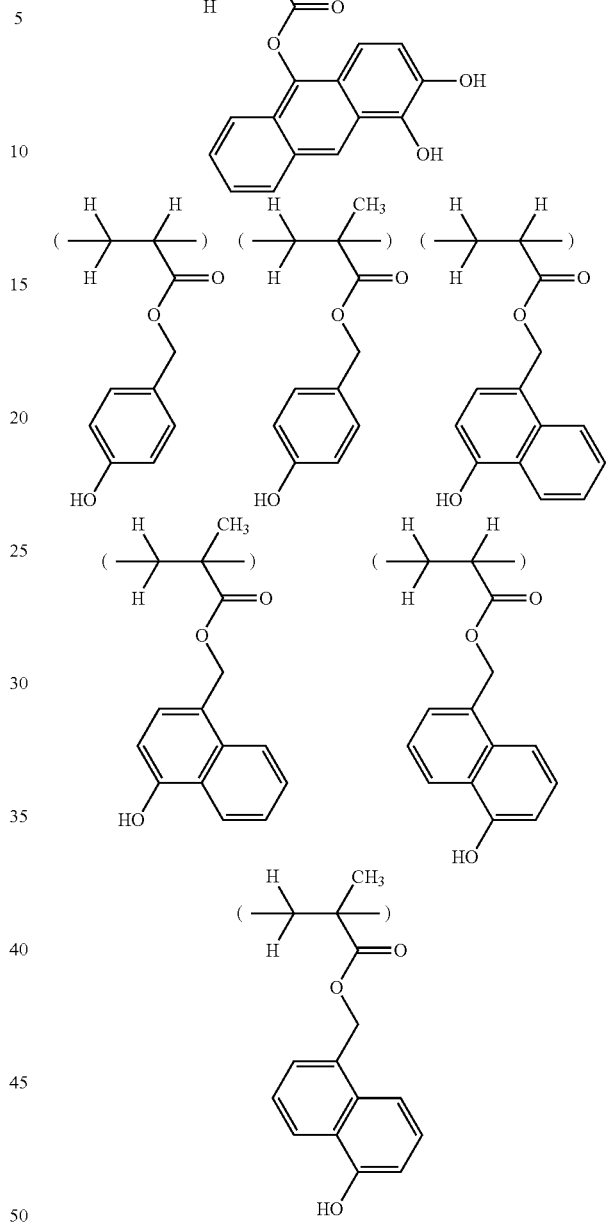

Examples of the recurring units of formula (2) wherein g=0 include styrene, vinylnaphthalene, vinylanthracene, and substituted forms of the foregoing wherein the aromatic ring is substituted with a halogen, acyloxy, alkyl or alkoxy group. Examples of the recurring units of formula (2) wherein g=0 and having a linker (—CO—O—B—) derived from a (meth) acrylate include the preferred structures wherein g is at least 1, with the hydroxyl group being eliminated or with the hydrogen of the hydroxyl group being substituted by an acyl or alkyl group.

In formula (3), $R^1$ is as defined in formula (1). $R^4$ and c are as defined for $R^2$ and a in formula (1), respectively. Preferred examples of these groups are the same as enumerated above. The linker C is as defined for A in formula (1), and preferred examples thereof are the same as enumerated above.

In formula (3), D is a single bond or a divalent, straight, branched or cyclic, aliphatic hydrocarbon group of 1 to 10 carbon atoms which may be substituted with fluorine and which may contain an ethereal oxygen atom, carbonyl group or carbonyloxy group at an intermediate of the chain. $Rf_1$ and $Rf_2$ each are a $C_1$-$C_6$ alkyl group having at least one fluorine atom, and $Rf_1$ may bond with D to form a ring with the carbon atom to which they are attached.

In the case of r=1, an aromatic ring intervenes between the polymer main chain and the hydroxyl group on the carbon bonded to fluoro-substituted vicinal carbons. The subscript v indicative of the number of substituents on D is 1 or 2. Where D is not a single bond, D has one or two hydroxyl groups each on the carbon bonded to fluoro-substituted vicinal carbons.

In the case of r=0, p is 1, C is a single bond, and D is bonded to the polymer main chain via a carbonyloxy group. In this case too, D has one or two hydroxyl groups each on the carbon bonded to fluoro-substituted vicinal carbons.

Preferred examples of the recurring unit having formula (3) are shown below, but not limited thereto.

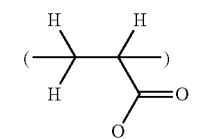
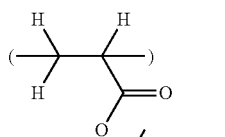
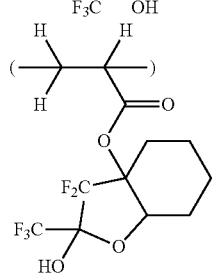
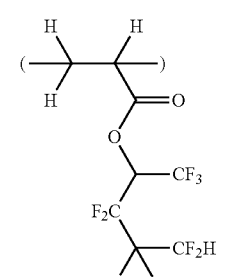
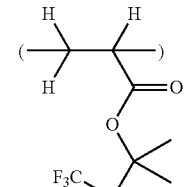
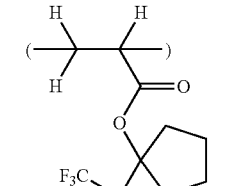
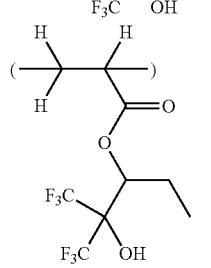
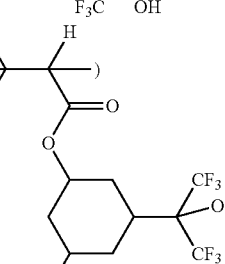
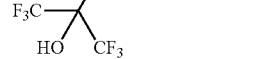

-continued

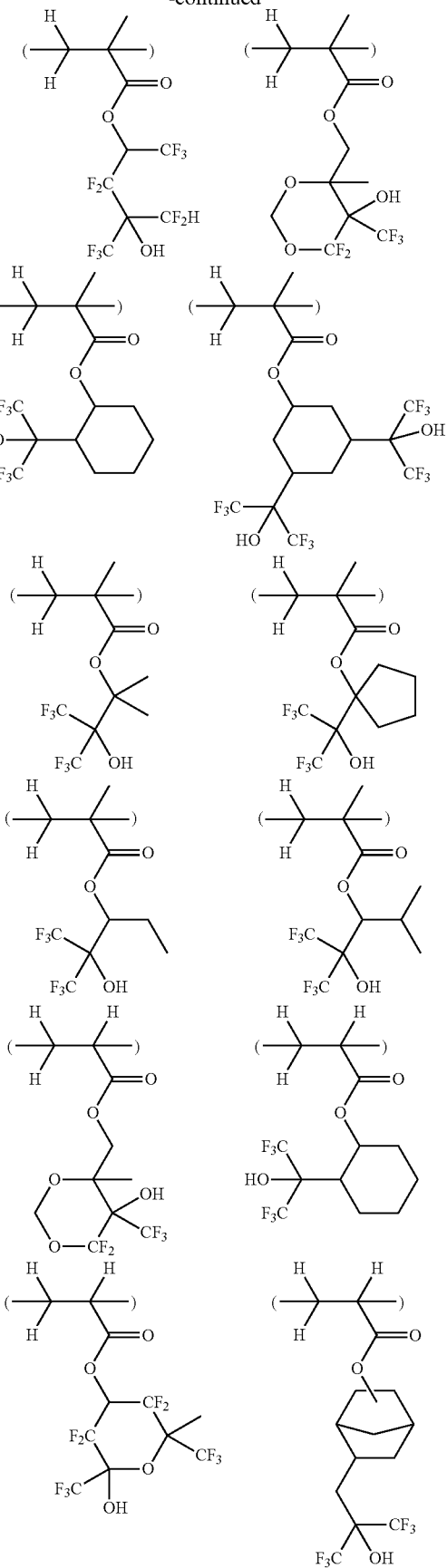

-continued

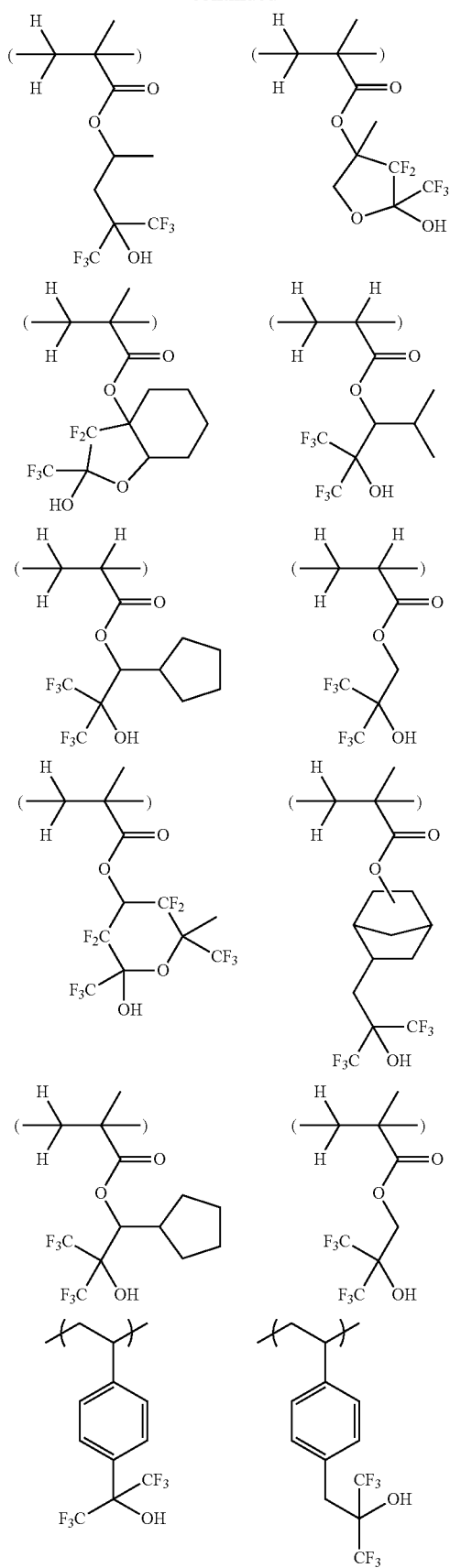

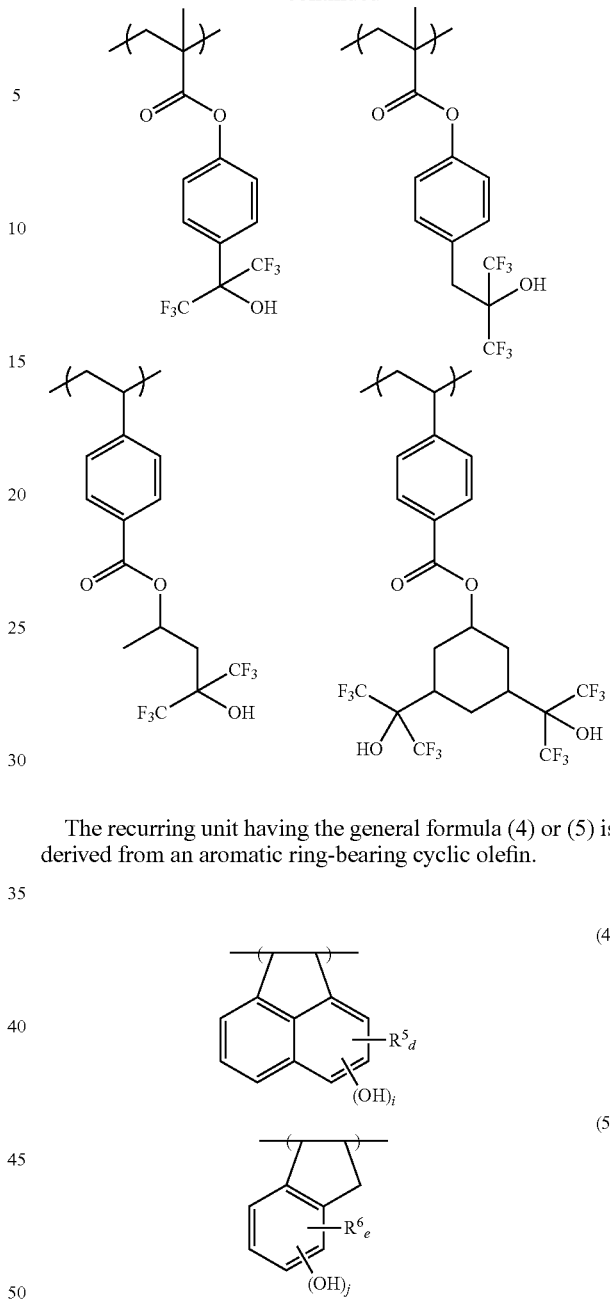

The recurring unit having the general formula (4) or (5) is derived from an aromatic ring-bearing cyclic olefin.

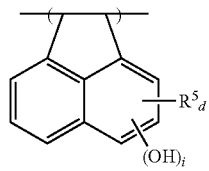   (4)

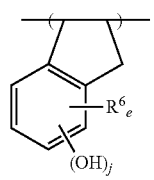   (5)

When a resist film of a resist composition based on a polymer comprising recurring units of formula (1), recurring units of at least one type selected from formulae (2) and (3), and recurring units of at least one type selected from formulae (4) and (5) is exposed to a pattern of EB or EUV including both isolated feature and isolated space portions, the resist composition is successful in fully suppressing the size shift between the irradiated pattern and the formed pattern and establishing a high resolution at the same time.

In formulae (4) and (5), $R^5$ and d, and $R^6$ and e are as defined for $R^2$ and a in formula (1), respectively. Preferred examples are the same as enumerated above.

From a relationship to the other recurring units, units of formula (4) or (5) wherein i or j is at least 1 may be used for enhancing the alkali dissolution of the polymer. In such a case, the following derivatives are preferably used to attain the desired effect while they are readily available.

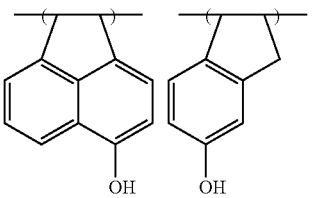

In the overall recurring units of the polymer, at least one of the selected recurring units other than the recurring units having formula (1) has at least one phenolic hydroxyl group and/or fluoroalcohol group, and the total of the foregoing recurring units other than the recurring units having formula (1) accounts for 25 to 95 mol %, preferably 40 to 90 mol % based on the overall recurring units of the polymer.

The polymer used in the resist composition is dissolvable in an aqueous alkaline developer. The recurring units of formula (2) wherein $g \geq 1$, recurring units of formula (3), recurring units of formula (4) wherein $i \geq 1$, and recurring units of formula (5) wherein $j \geq 1$ constitute a class of recurring units contributing to alkaline solubility and substrate adhesion. Then the total of recurring units belonging to this class should account for 25 to 95 mol %, preferably 40 to 80 mol % based on the overall recurring units of the polymer. Notably, if the sum of recurring units of formula (4) wherein $i \geq 1$ and recurring units of formula (5) wherein $j \geq 1$ accounts for more than half the total of recurring units belonging to this class, the total of recurring units belonging to this class should preferably be at least 40 mol % based on the overall recurring units of the polymer. If the sum of recurring units of formula (2) wherein $g \geq 1$ and recurring units of formula (3) accounts for at least 20 mol % based on the overall recurring units of the polymer, the total of recurring units belonging to this class should preferably be up to 80 mol % based on the overall recurring units of the polymer. If the total of recurring units belonging to this class is below the lower limit, there is a likelihood of scumming upon development and bridging between resist pattern features. A high resolution is readily achieved when recurring units of formula (2) wherein $g \geq 1$ account for 50 to 70 mol % based on the overall recurring units of the polymer.

When a resist film formed from the resist composition is exposed to a pattern of EB or EUV including both isolated feature and isolated space portions, the resist composition is effective in suppressing the size shift between the irradiated pattern and the formed pattern. This effect of suppressing the pattern size shift is attributable to the negative working function of the hydroxyl group in the recurring unit of formula (1) which undergoes elimination reaction under the action of acid. The recurring units of formula (1) should preferably account for 5 to 75 mol %, more preferably 10 to 60 mol %, based on the overall recurring units of the polymer before the effect can be attained. If the content of recurring units of formula (1) is less than 5 mol %, a change of alkaline solubility due to acid-catalyzed reaction of recurring units of formula (1) is insufficient, failing to achieve the desired effect.

To give the polymer an appropriate allowance for thermal vibration, the sum of recurring units of formulae (4) and (5) is preferably 3 to 30 mol %, more preferably 5 to 20 mol % based on the overall recurring units of the polymer.

The sum of units of at least one type selected from among recurring units of formula (2) wherein $g \geq 1$, recurring units of formula (3), recurring units of formula (4) wherein $i \geq 1$, and recurring units of formula (5) wherein $j \geq 1$, and units of formula (1), or the sum of the foregoing units plus recurring units of formula (2) wherein $g=0$, recurring units of formula (4) wherein $i=0$, and recurring units of formula (5) wherein $j=0$, is adjusted so that the polymer may have an appropriate dissolution rate to form the desired pattern. Specifically the sum of these units is preferably up to 30 mol %, more preferably up to 20 mol % based on the overall recurring units of the polymer, and especially preferred recurring units of formula (8) as formula (4) wherein $i=0$, is adjusted so that the polymer may have an appropriate dissolution rate to form the desired pattern.

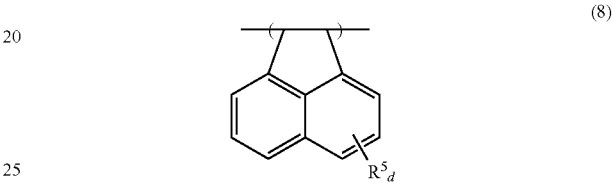

($R^5$ and d are as defined in formula (4).)

If the sum of these units exceeds 30 mol %, the polymer may have too low a dissolution rate, with a likelihood of scumming upon development.

Other recurring units may be incorporated as long as the content thereof is up to 50 mol %. Suitable recurring units which can be additionally incorporated include units having the general formulae (9), (10) and (11):

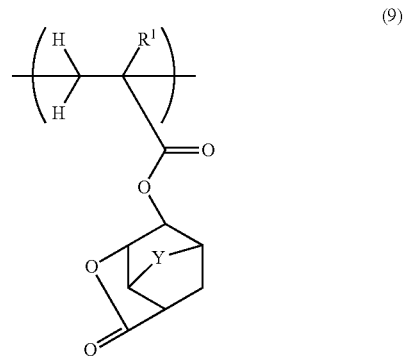

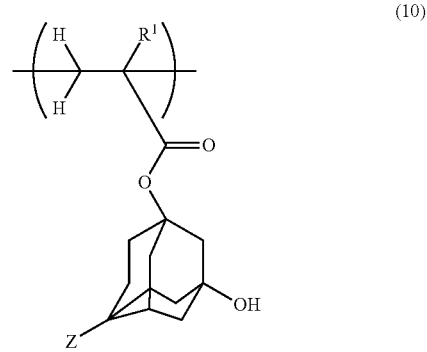

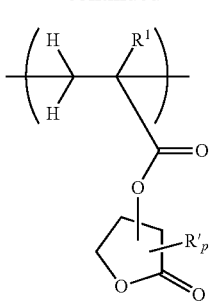

(11)

wherein $R^1$ is hydrogen, methyl or trifluoromethyl, Y is an oxygen atom or methylene group, Z is hydrogen or hydroxyl, R' is $C_1$-$C_4$ alkyl, and p is an integer of 0 to 3. Due to a lack of acidity, these units may be used as a supplemental unit for providing adhesion to substrates.

The polymer defined above can be advantageously used as the base polymer in a chemically amplified negative resist composition. The base polymers used in conventional chemically amplified negative resist compositions and inventive chemically amplified negative resist composition should be essentially endowed with the function of providing solubility in an alkaline developer, typically 2.38 wt % tetramethylammonium hydroxide aqueous solution, the function of providing adhesion to substrates, and the function of reacting with a crosslinking functional group, and preferably further with the function of controlling solubility in alkaline developer and the function of providing etch resistance. To obtain these functions, a polymer having, in combination, recurring units meeting individual functions may be used alone, or two or more polymers may be combined to form a polymer blend capable of meeting all the functions.

As the base polymer, a blend of different polymers may be used as described just above. When a blend is not used, a polymer may be designed by selecting recurring units each having one or more of the above functions, and determining a formulation ratio of individual recurring units so as to endow a resist film with the desired resolution.

The polymer comprising a plurality of the recurring units defined above can be obtained in a standard way by performing copolymerization of corresponding monomers while combining protection and deprotection reactions if necessary. The preferred copolymerization reaction is radical polymerization, but not limited thereto. With respect to the polymerization reaction, reference may be made to Patent Document 3.

The polymer preferably has a weight average molecular weight (Mw) of 1,000 to 50,000, and more preferably 1,000 to 20,000 as measured by gel permeation chromatography (GPC) versus polystyrene standards. A polymer with a Mw of less than 1,000 may be reduced in resolution and form a pattern having a rounded top and degraded line edge roughness (LER). A polymer with a Mw in excess of the range tends to increase LER, though depending on the pattern to be resolved. It is recommended to control the Mw of a polymer to 20,000 or less, particularly when a pattern having a line width of up to 100 nm is formed.

The polymer preferably has a narrow dispersity as demonstrated by a molecular weight distribution Mw/Mn in the range of 1.0 to 3.0, more preferably 1.0 to 2.5. A broader dispersity may cause drawbacks to the pattern such as foreign matter after development and degraded profile.

In addition to the resist polymer comprising recurring units of formula (1), an additional resist polymer free of recurring units of formula (1) may be added to the resist composition. The additional resist polymer free of recurring units of formula (1) is a polymer adapted to be insolubilized by reacting with a crosslinker (to be described later) or the recurring unit having a crosslinking ability, if any, in the resist polymer. To avoid any increase of LER, the additional resist polymer must be fully compatible with the resist polymer comprising recurring units of formula (1). Preferred in this sense are those resist polymers free of recurring units of formula (1) and comprising recurring units which are similar to the recurring units in the resist polymer comprising recurring units of formula (1) as predominant units, and specifically, resist polymers comprising recurring units of formulae (2) to (11) as predominant units.

When an additional polymer free of recurring units of formula (1) comprising recurring units of one or more type selected from formulae (2) to (8) as predominant units is used in combination with the resist polymer comprising recurring units of formula (1), the additional polymer free of recurring units of formula (1) may be used alone or in admixture of two or more. The important factors to be considered in the designing of the additional polymer are compatibility and dissolution rate.

In order that a resist film have an appropriate dissolution rate, an additional polymer free of recurring units of formula (1) should preferably meet that the total of recurring units of formula (2) wherein g≥1, recurring units of formula (3), recurring units of formula (4) wherein i≥1, and recurring units of formula (5) wherein j≥1 (belonging to the same class) is 40 to 95 mol %, more preferably 50 to 80 mol % based on the overall recurring units of the additional polymer free of recurring units of formula (1). If the total of recurring units belonging to the class is less than 40 mol %, there is a likelihood of scumming upon development and bridging between pattern features. If the total exceeds 95 mol %, the pattern being formed is prone to be undercut and on a certain substrate, to collapse down. As the remaining recurring units, recurring units of formula (2) wherein g=0, recurring units of formula (4) wherein i=0, and recurring units of formula (5) wherein j=0 are effective for providing good compatibility and etching properties.

When an additional polymer free of recurring units of formula (1) comprising recurring units of one or more type selected from formulae (2) to (8) as predominant units is blended with the resist polymer comprising recurring units of formula (1), the resist polymer comprising recurring units of formula (1) is preferably present in a range of 30 to 100% by weight of the blend. If the content of the resist polymer comprising recurring units of formula (1) is less than 30% by weight, the polymer blend may fail to achieve the desired resolution and the LER improving effect.

In general, a crosslinker need not be added to the chemically amplified negative resist composition. When fine adjustment of resist performance is desired, the crosslinker may be added in an amount of 0.5 to 5 parts by weight per 100 parts by weight of the resist polymer. Numerous crosslinkers suitable for use in chemically amplified negative resist compositions are known in the art, and exemplary crosslinkers are described in Patent Documents 1 to 3.

Suitable crosslinkers which can be separately added to the resist composition include alkoxymethylglycolurils and alkoxymethylmelamines. Examples include tetramethoxymethylglycoluril, 1,3-bismethoxymethyl-4,5-bismethoxyethyleneurea, bismethoxymethylurea, hexamethoxymethylmelamine, and hexaethoxymethylmelamine. The crosslinkers may be used alone or in admixture.

An acid generator is added to the resist composition. Preferably the acid generator is used in an amount of 2 to 20 parts, more preferably 5 to 15 parts by weight per 100 parts by weight of the polymer. Depending on the resist properties to be tailored, a suitable acid generator may be selected from well-known acid generators, for example, those described in Patent Documents 1 to 3. Examples of the acid generator are shown below, but not limited thereto.

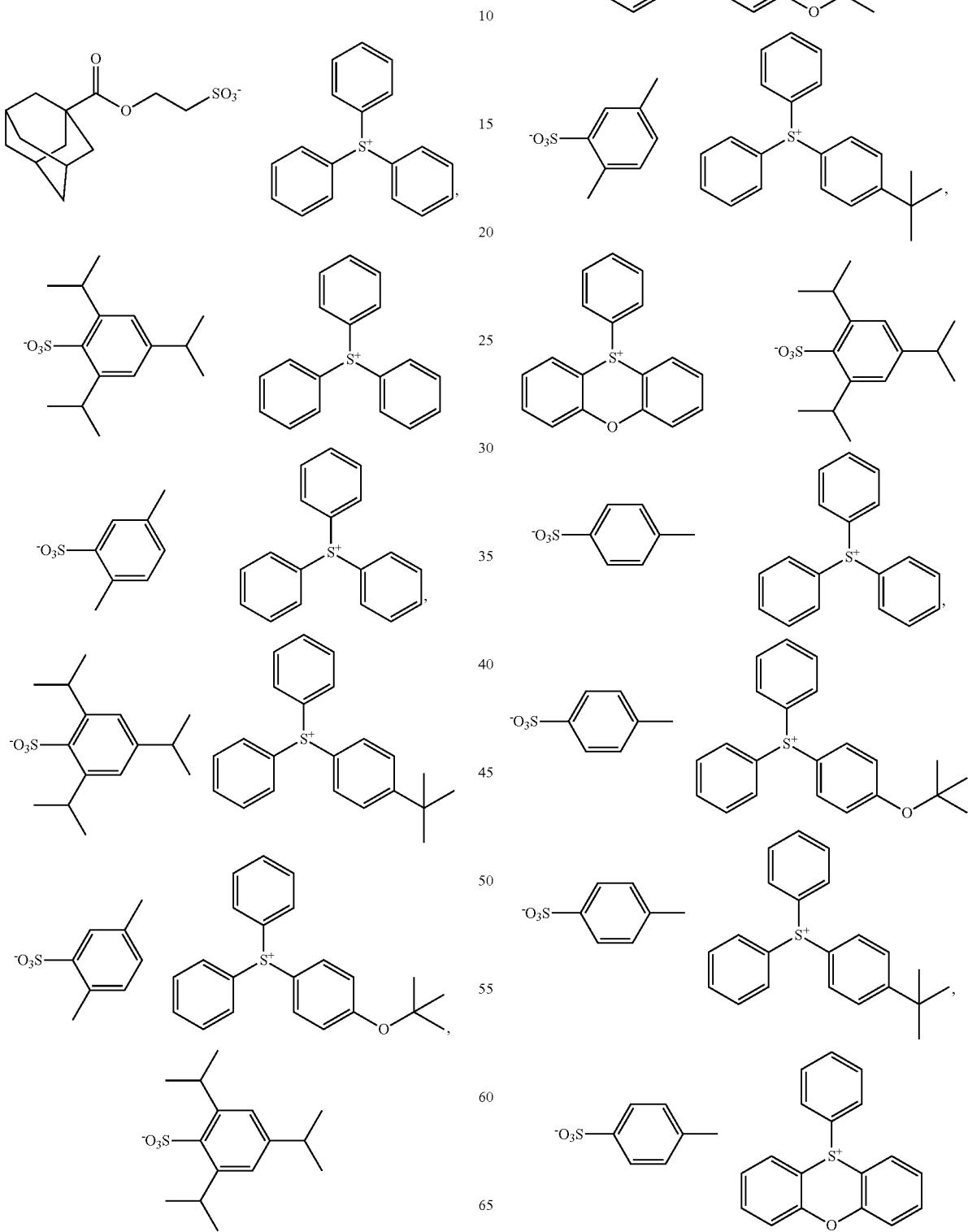

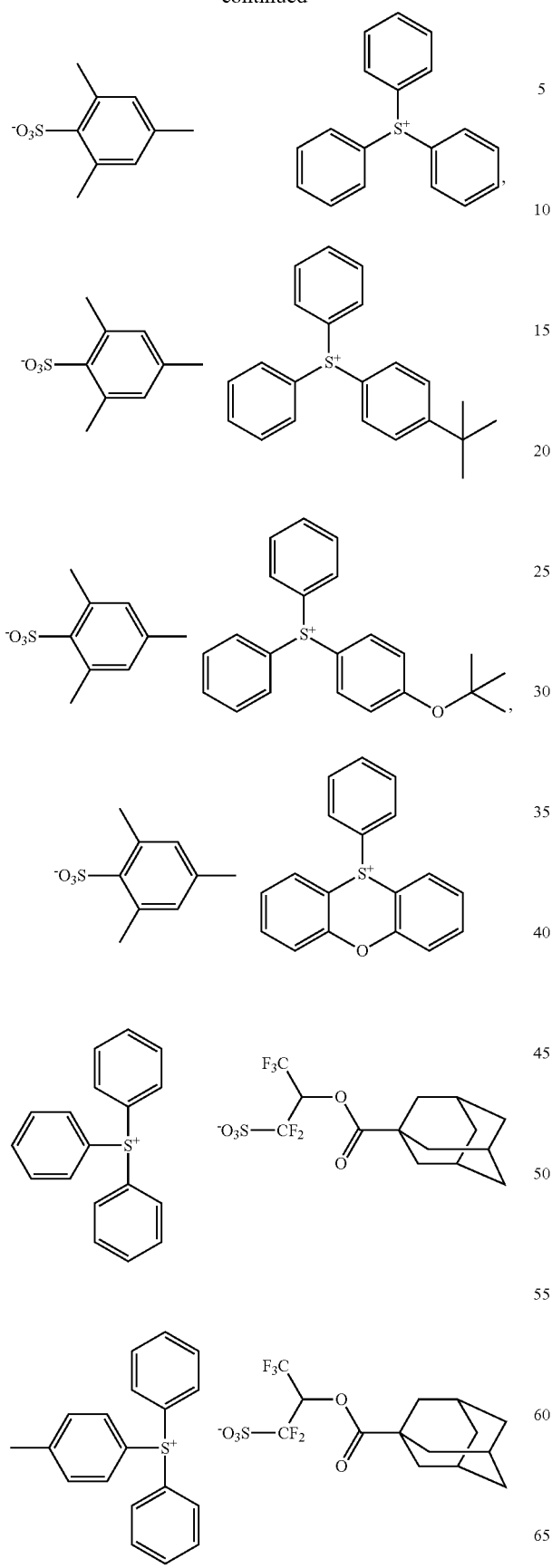
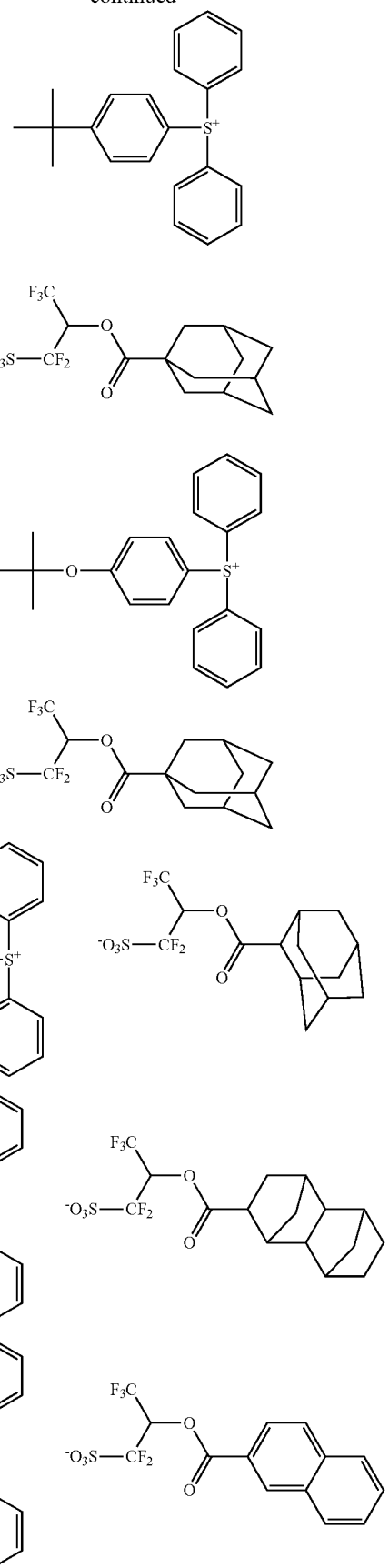

33
-continued
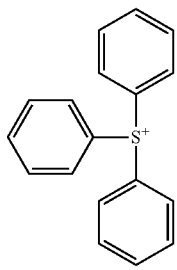 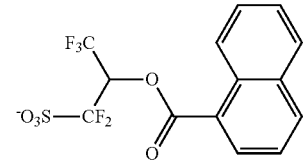
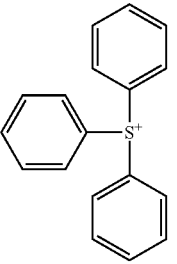 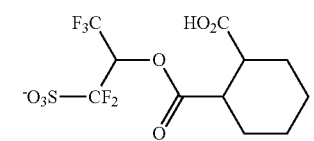
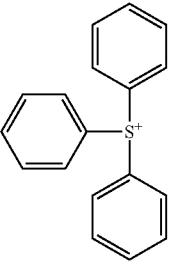 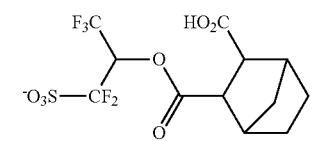
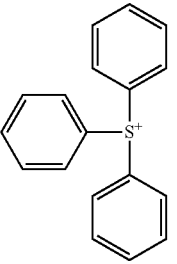 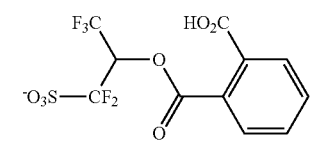
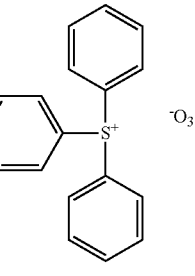 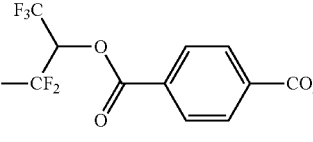
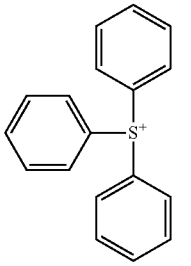 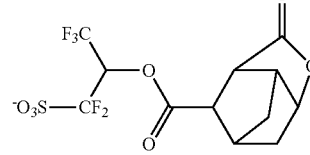
34
-continued
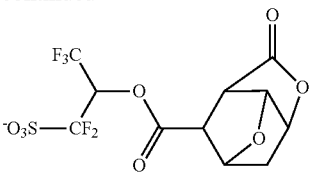
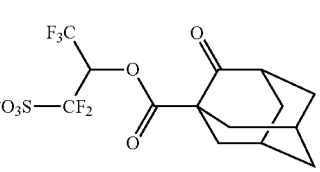
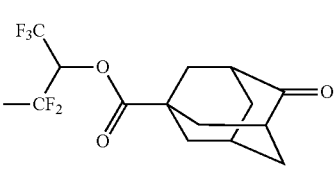
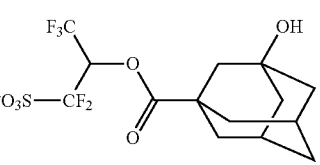
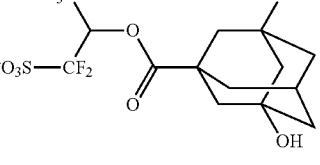
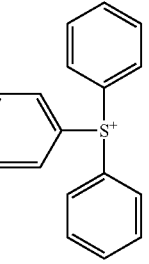

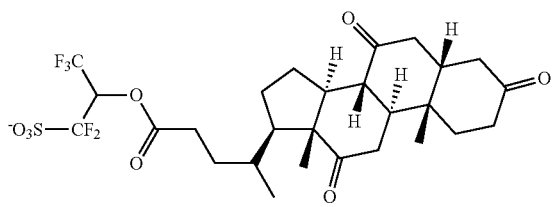

In conventional resist compositions, a basic compound is, in fact, an essential component for sensitivity adjustment and resolution enhancement. A basic compound may be added to the resist composition of the invention as well. The basic compound is preferably added in an amount of 0.01 to 5 parts, more preferably 0.05 to 3 parts by weight per 100 parts by weight of the polymer. Numerous basic compounds are known and described, for example, in Patent Documents 1 to 5. Suitable basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Many exemplary compounds are described in Patent Document 2. Any basic compounds may generally be used while two or more basic compounds may be selected and used in admixture. Among these basic compounds, tris (2-(methoxymethoxy)ethyl)amine, tris(2-(methoxymethoxy)ethyl)amine-N-oxide, morpholine derivatives, and imidazole derivatives are most preferred.

An amine is effective when a resist pattern is formed on a substrate, typically a substrate having a surface layer of chromium compound, which is susceptible to a phenomenon that the resist film becomes substantially insoluble at the substrate interface during pattern formation, known as a footing phenomenon. Specifically, an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) is effectively used for improving the pattern profile.

Preferred examples of the amine or amine oxide compound having a carboxyl group, but free of hydrogen in covalent bond with nitrogen serving as basic center include compounds of the general formulae (12) to (14), but are not limited thereto.

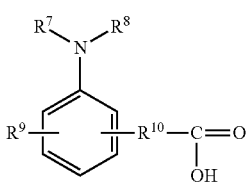

(12)

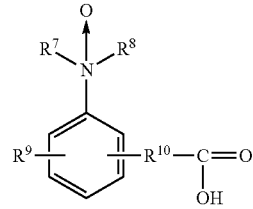

(13)

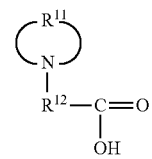

(14)

Herein $R^7$ and $R^8$ are each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, or $C_1$-$C_{10}$ alkylthioalkyl group. $R^7$ and $R^8$ may bond together to form a ring with the nitrogen atom to which they are attached. $R^9$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, $C_1$-$C_{10}$ alkylthioalkyl group, or halogen. $R^{10}$ is a single bond, a straight, branched or cyclic $C_1$-$C_{20}$ alkylene group, or $C_6$-$C_{20}$ arylene group. $R^{11}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{12}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_1$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (12) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferred examples of the amine oxide compound of formula (13) include oxidized forms of exemplary amine compounds of formula (12), but are not limited thereto.

Preferred examples of the amine compound of formula (14) include, but are not limited to, 1-piperidinepropionic acid, 1-piperidinebutyric acid, 1-piperidinemalic acid, 1-piperidinepyruvic acid, and 1-piperidinelactic acid.

The compound having an amine oxide structure represented by formula (13) may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. Reference may be made to Patent Document 1.

The reaction involved is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to Patent Document 12.

To the resist composition, any of the surfactants commonly used for improving coating characteristics may be added. A number of surfactants are well known and described in Patent Documents 1 to 5 and any suitable one may be selected therefrom. Besides, fluorine-containing polymers as described in Patent Document 13 may be added.

In the resist composition, the surfactant is preferably formulated in an amount of up to 2 parts, and more preferably up to 1 part by weight, per 100 parts by weight of the overall polymer. When used, the surfactant is preferably added in an amount of at least 0.01 part by weight.

An organic solvent may be used in the preparation of the resist composition. It may be any of organic solvents in which the polymer, acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the resist composition, the organic solvent is preferably used in an amount of 1,000 to 10,000 parts by weight, more preferably 2,000 to 9,700 parts by weight per 100 parts by weight of the overall polymer. When adjusted to such a concentration, the resist composition is applicable by a spin coating technique to form a resist film having a thickness of 10 to 300 nm and an improved flatness in a consistent manner.

If desired, any of well-known surfactants and dissolution inhibitors may be added to the resist composition. Although the detail of dissolution inhibitor is omitted herein, reference may be made to the cited Patent Documents.

Process

Pattern formation using the resist composition of the invention may be performed by well-known lithography processes. The process generally involves coating, prebaking, exposure to high-energy radiation (typically EB or EUV), PEB, and development with alkaline developer. The resist composition is first applied onto a substrate for IC fabrication (silicon wafer having a surface layer of Si, $SiO_2$, SiN, SiON, TiN, WSi, BPSG, SOG, organic antireflective coating or the like) or a substrate for mask circuit fabrication (quartz substrate having a surface layer of Cr, CrO, CrON, MoSi or the like) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 µm thick.

Then the resist film is exposed to high-energy radiation, such as deep UV, excimer laser, x-ray or EUV through a mask having a desired pattern. Alternatively, a pattern is written on the resist film directly with EB. The exposure dose is preferably 1 to 200 mJ/cm$^2$, more preferably 10 to 100 mJ/cm$^2$. The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 10 minutes, preferably 80 to 140° C. for 1 to 5 is minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

One advantage is that the resist film has high etch resistance. Also the resist composition is effective when it is required that the pattern experience a minimal change of line width even when the duration between exposure and PEB is prolonged. Because of these advantages, the resist composition is effective in processing a photomask blank by EB lithography. The resist composition is effectively applicable to a processable substrate, specifically a substrate having a surface layer of material to which a resist film is less adherent and which is likely to invite pattern stripping or pattern collapse, and particularly a substrate having sputter deposited thereon a surface layer material susceptible to pattern collapse, typically metallic chromium or a chromium compound containing at least one light element selected from oxygen, nitrogen and carbon. Substrates of this nature are often used in photomask blanks, and the invention is effective for pattern formation on these substrates.

EXAMPLES

Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. Me stands for methyl. The compositional ratio of a copolymer is on a molar basis.

Polymer Synthesis Example 1

In a 200-mL dropping funnel under nitrogen blanket, a solution was prepared by dissolving 39.26 g of 4-acetoxystyrene, 6.16 g of acenaphthylene, 19.6 g of 4-(2-hydroxy-2-propyl)styrene, and 7.43 g of dimethyl 2,2'-azobis(2-methylpropionate) (V601, Wako Pure Chemical Industries, Ltd.) in 90 g of methyl ethyl ketone (MEK) as a solvent. A 500-mL polymerization flask was purged with nitrogen, charged with 60 g of MEK, and heated at 80° C. In this state, the solution was added dropwise to the flask over 4 hours. After the completion of dropwise addition, stirring was continued for 18 hours while maintaining the polymerization temperature of 80° C. The polymerization solution was then cooled down to room temperature and added dropwise to 1,000 g of hexane whereupon a copolymer precipitated. The copolymer precipitate was collected by filtration and washed twice with 200 g of hexane. In a 1-L flask under nitrogen atmosphere, the copolymer was dissolved in a solvent mixture of 126 g of tetrahydrofuran and 42 g of methanol. The solution was combined with 16.3 g of ethanol amine and stirred for 3 hours at 60° C. The reaction solution was concentrated in vacuum. The concentrate was dissolved in a solvent mixture of 300 g of ethyl acetate and 80 g of water. The solution was transferred to a separatory funnel, where 8.2 g of acetic acid was added, followed by separatory operation. Once the lower layer was distilled off, 80 g of water and 10.9 g of pyridine were added to the organic layer, followed by separatory operation again. Once the lower layer was distilled off, 80 g of water was added to the organic layer, followed by water washing and separatory operation (repeated 5 times in total). The organic layer thus separated was concentrated, and dissolved in 140 g of acetone. The acetone solution was added dropwise to 2,500 g of water, whereupon the crystallized precipitate was collected by filtration, washed with water, and suction filtered for 2 hours. The mass collected by filtration was dissolved in 150 g of acetone again. The acetone solution was added dropwise to 2,800 g of water. The crystallized precipitate was filtered, washed with water, and dried, yielding 45.0 g of a white polymer, designated Polymer 1. The polymer was analyzed by $^{13}$C-NMR, $^1$H-NMR, and GPC, with the results shown below.

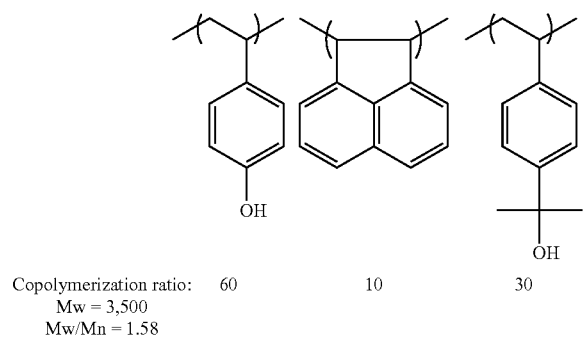

Copolymerization ratio: 60 10 30
Mw = 3,500
Mw/Mn = 1.58

Polymer Synthesis Example 2

In a 300-mL dropping funnel under nitrogen blanket, a solution was prepared by dissolving 39.5 g of 4-hydroquinone monomethacrylate, 7.0 g of acenaphthylene, 18.6 g of 4-(2-hydroxy-2-propyl)styrene, and 7.0 g of dimethyl 2,2'-azobis(2-methylpropionate) (V601, Wako Pure Chemical Industries, Ltd.) in 90 g of methyl ethyl ketone (MEK) as a solvent. A 500-mL polymerization flask was purged with nitrogen, charged with 60 g of MEK, and heated at 80° C. In this state, the solution was added dropwise to the flask over 4 hours. After the completion of dropwise addition, stirring was continued for 16 hours while maintaining the polymerization temperature of 80° C. The polymerization solution was then cooled down to room temperature and added is dropwise to 1,200 g of hexane whereupon a copolymer precipitated. The copolymer precipitate was collected by filtration and washed twice with 250 g of hexane. The mass collected by filtration was dissolved in 160 g of MEK again, and the MEK solution was added dropwise to 1,200 g of hexane whereupon a copolymer precipitated. The copolymer precipitate was collected by filtration and washed twice with 250 g of hexane. The mass collected by filtration was dried, yielding 55 g of a white copolymer, designated Polymer 8. The polymer was analyzed by $^{13}$C-NMR, $^1$H-NMR, and GPC, with the results shown below.

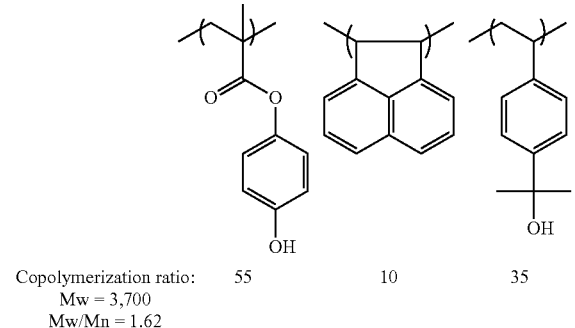

Copolymerization ratio: 55 10 35
Mw = 3,700
Mw/Mn = 1.62

Polymer Synthesis Examples 3 to 17

Polymers 2 to 7 and 9 to 17 shown in Table 1 were synthesized by the same procedure as Polymer Synthesis Example 1 or 2 except that the type and amount of monomers were changed. Units belonging to Classes A, B, C and Z in Table 1 have the structures shown in Tables 2 to 5, respectively. In Table 1, a ratio of each unit incorporated is on a molar basis.

TABLE 1

| Resin | Class A (ratio) | Class B (ratio) | Class C (ratio) | Class Z (ratio) |
|---|---|---|---|---|
| Polymer 1 | A-1 (0.60) | — | C-2 (0.10) | Z-1 (0.30) |
| Polymer 2 | A-1 (0.57) | — | C-2 (0.13) | Z-1 (0.30) |
| Polymer 3 | A-1 (0.60) | — | C-1 (0.10) | Z-1 (0.30) |
| Polymer 4 | A-1 (0.60) | B-1 (0.10) | — | Z-1 (0.30) |
| Polymer 5 | A-1 (0.60) | B-2 (0.10) | — | Z-1 (0.30) |
| Polymer 6 | A-1 (0.60) | B-3 (0.10) | — | Z-1 (0.30) |
| Polymer 7 | A-1 (0.55) | — | C-2 (0.15) | Z-1 (0.30) |
| Polymer 8 | A-2 (0.54) | — | C-2 (0.10) | Z-1 (0.36) |
| Polymer 9 | A-3 (0.75) | — | C-2 (0.05) | Z-1 (0.20) |

TABLE 1-continued

| Resin | Class A (ratio) | Class B (ratio) | Class C (ratio) | Class Z (ratio) |
|---|---|---|---|---|
| Polymer 10 | A-1 (0.27) A-4 (0.27) | — | C-2 (0.20) | Z-1 (0.26) |
| Polymer 11 | A-4 (0.52) | — | C-2 (0.10) | Z-1 (0.38) |
| Polymer 12 | A-1 (0.60) | — | C-2 (0.10) | Z-2 (0.30) |
| Polymer 13 | A-1 (0.70) | — | C-2 (0.05) | Z-3 (0.25) |
| Polymer 14 | A-1 (0.60) | B-1 (0.05) | C-2 (0.05) | Z-1 (0.30) |
| Polymer 15 | A-1 (0.60) | B-2 (0.05) | C-2 (0.05) | Z-1 (0.30) |
| Polymer 16 | A-1 (0.60) | B-3 (0.05) | C-2 (0.05) | Z-1 (0.30) |
| Polymer 17 | A-1 (0.60) | B-4 (0.05) | C-2 (0.05) | Z-1 (0.30) |

TABLE 2

Recurring units of formula (2) wherein g = 1 and recurring units of formula (3) belonging to Class A

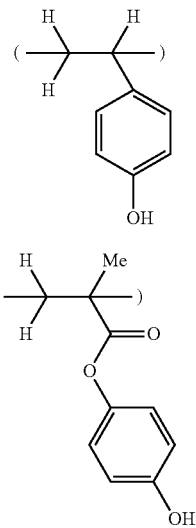

A-1

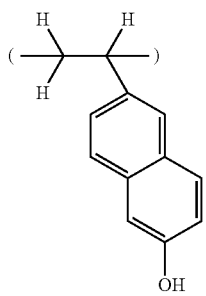

A-3

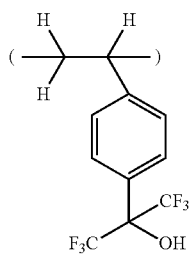 [SMILES: CCC(C)c1ccc(C(O)(C(F)(F)F)C(F)(F)F)cc1]

A-4

TABLE 3

Recurring units of formula (2) wherein g = 0 belonging to Class B

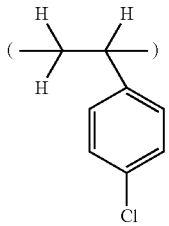

B-1, B-2

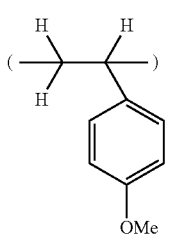

B-3, B-4

TABLE 4

Recurring units of formulae (4) and (5) belonging to Class C

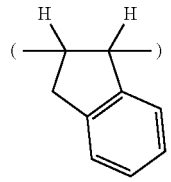

C-1

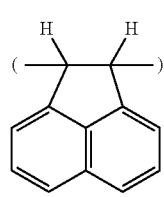

C-2

TABLE 5

Recurring units of formula (1) belonging to Class Z

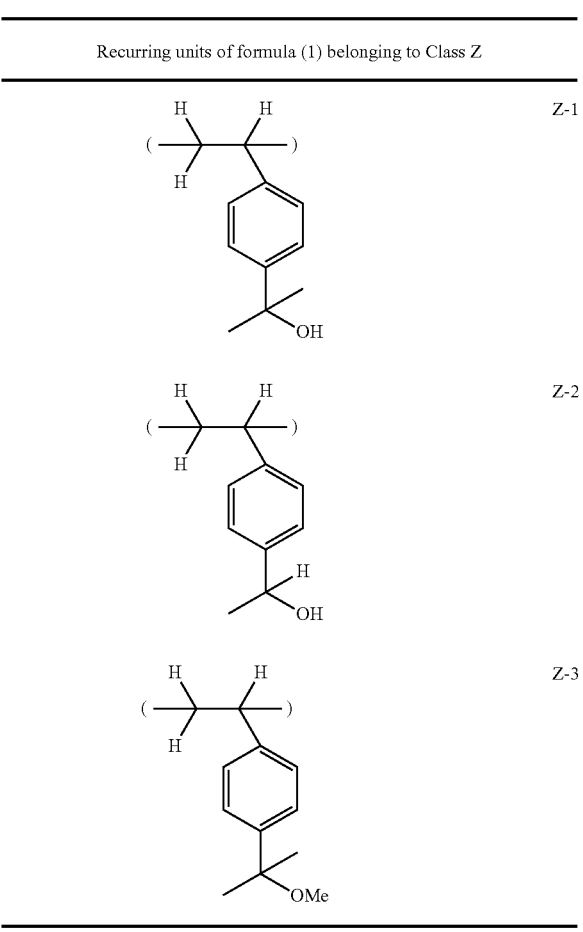

Examples and Comparative Examples

Preparation of Negative Resist Compositions

Resist compositions were prepared by using inventive polymers (Polymer 1 to 17) or comparative polymers (Polymers J, K and L), and dissolving the polymer, an acid generator (PAG-A or PAG-B), and a basic compound (Base-1 or Base-2 or Base-3) in an organic solvent mixture in accordance with the recipe shown in Tables 6-1 and 6-2. These compositions were each filtered through a Teflon® filter having a pore size of 0.2 μm, thereby giving negative resist composition solutions.

Polymer J

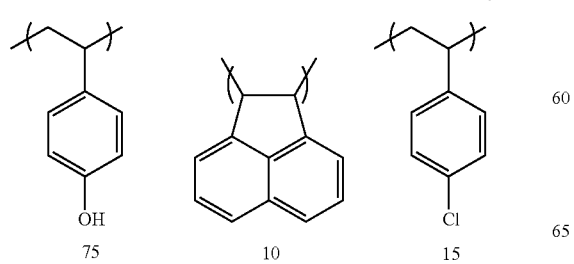

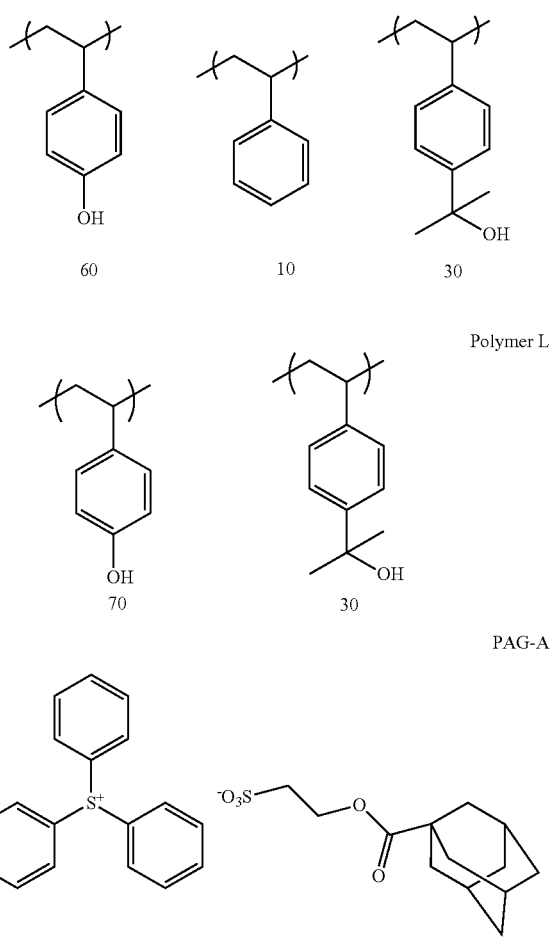

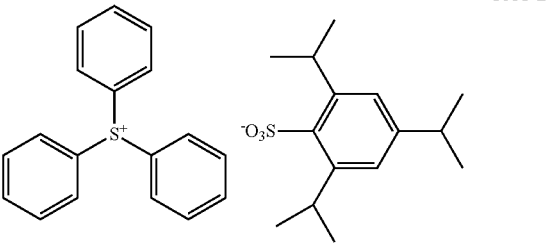

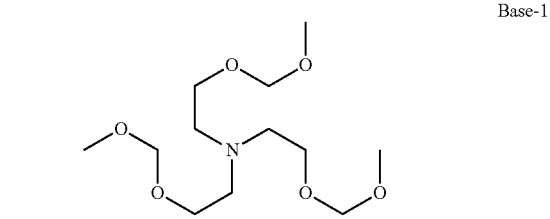

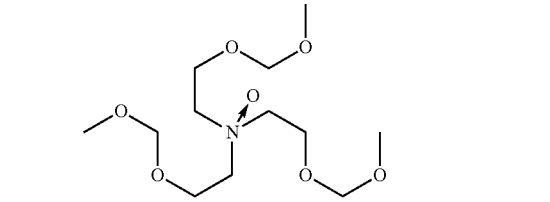

-continued

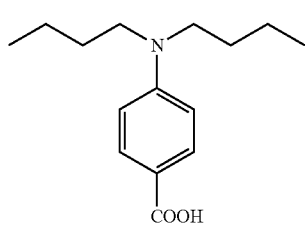

Base-3

The organic solvents used were propylene glycol monomethyl ether acetate (PGMEA) and ethyl lactate (EL). Some solutions further contained tetramethoxymethylglycoluril (TMGU) as a crosslinker and 0.075 pbw (relative to solids) of a surfactant PF-636 (Omnova Solutions, Inc.).

TABLE 6-1

| | Resin (pbw) | PAG (pbw) | Base (pbw) | Additive 1 (pbw) | Additive 2 (pbw) | Solvent 1 (pbw) | Solvent 2 (pbw) |
|---|---|---|---|---|---|---|---|
| Example 1 | Polymer 1 (80) | PAG-A (10) | Base-1 (0.7) | — | — | PGMEA (1,109) | EL (2,587) |
| Example 2 | Polymer 1 (80) | PAG-B (10) | Base-1 (0.7) | — | — | PGMEA (1,109) | EL (2,587) |
| Example 3 | Polymer 1 (80) | PAG-A (5) PAG-B (5) | Base-1 (0.7) | — | — | PGMEA (1,109) | EL (2,587) |
| Example 4 | Polymer 1 (80) | PAG-B (10) | Base-1 (0.4) Base-2 (0.3) | — | — | PGMEA (1,109) | EL (2,587) |
| Example 5 | Polymer 1 (80) | PAG-B (10) | Base-2 (0.8) | — | — | PGMEA (1,109) | EL (2,587) |
| Example 6 | Polymer 1 (80) | PAG-B (10) | Base-2 (0.6) Base-3 (0.2) | — | — | PGMEA (1,109) | EL (2,587) |
| Example 7 | Polymer 1 (80) | PAG-B (10) | Base-1 (0.6) Base-3 (0.2) | — | — | PGMEA (1,109) | EL (2,587) |
| Example 8 | Polymer 1 (80) | PAG-B (10) | Base-1 (0.7) | TMGU (2.0) | — | PGMEA (1,109) | EL (2,587) |
| Example 9 | Polymer 1 (40) Polymer J (40) | PAG-B (10) | Base-1 (0.7) | TMGU (4.0) | — | PGMEA (1,109) | EL (2,587) |
| Example 10 | Polymer 2 (80) | PAG-B (10) | Base-1 (0.7) | — | — | PGMEA (1,109) | EL (2,587) |
| Example 11 | Polymer 3 (80) | PAG-B (10) | Base-1 (0.7) | — | — | PGMEA (1,109) | EL (2,587) |
| Example 12 | Polymer 4 (80) | PAG-B (10) | Base-1 (0.7) | — | — | PGMEA (1,109) | EL (2,587) |
| Example 13 | Polymer 5 (80) | PAG-B (10) | Base-1 (0.7) | — | — | PGMEA (1,109) | EL (2,587) |
| Example 14 | Polymer 6 (80) | PAG-B (10) | Base-1 (0.7) | — | — | PGMEA (1,109) | EL (2,587) |
| Example 15 | Polymer 7 (80) | PAG-B (10) | Base-1 (0.7) | — | — | PGMEA (1,109) | EL (2,587) |
| Example 16 | Polymer 8 (80) | PAG-B (10) | Base-1 (0.7) | — | — | PGMEA (1,109) | EL (2,587) |
| Example 17 | Polymer 9 (80) | PAG-B (10) | Base-1 (0.7) | — | — | PGMEA (1,109) | EL (2,587) |
| Example 18 | Polymer 10 (80) | PAG-B (10) | Base-1 (0.7) | — | — | PGMEA (1,109) | EL (2,587) |
| Example 19 | Polymer 11 (80) | PAG-B (10) | Base-1 (0.7) | — | — | PGMEA (1,109) | EL (2,587) |
| Example 20 | Polymer 12 (80) | PAG-B (10) | Base-1 (0.7) | — | — | PGMEA (1,109) | EL (2,587) |
| Example 21 | Polymer 13 (80) | PAG-B (10) | Base-1 (0.5) | — | — | PGMEA (1,109) | EL (2,587) |
| Example 22 | Polymer 14 (80) | PAG-B (10) | Base-1 (0.7) | — | — | PGMEA (1,109) | EL (2,587) |
| Example 23 | Polymer 15 (80) | PAG-B (10) | Base-1 (0.7) | — | — | PGMEA (1,109) | EL (2,587) |
| Example 24 | Polymer 16 (80) | PAG-B (10) | Base-1 (0.7) | — | — | PGMEA (1,109) | EL (2,587) |
| Example 25 | Polymer 17 (80) | PAG-B (10) | Base-1 (0.7) | — | — | PGMEA (1,109) | EL (2,587) |

TABLE 6-2

|  | Resin (pbw) | PAG (pbw) | Base (pbw) | Additive 1 (pbw) | Additive 2 (pbw) | Solvent 1 (pbw) | Solvent 2 (pbw) |
|---|---|---|---|---|---|---|---|
| Comparative Example 1 | Polymer J (80) | PAG-B (10) | Base-1 (0.7) |  | TMGU (8.2) | PGMEA (1,109) | EL (2,587) |
| Comparative Example 2 | Polymer K (80) | PAG-B (10) | Base-1 (0.7) |  | — | PGMEA (1,109) | EL (2,587) |
| Comparative Example 3 | Polymer L (80) | PAG-B (10) | Base-1 (0.7) |  | — | PGMEA (1,109) | EL (2,587) |

Evaluation of EB Image Writing

Using a coater/developer system ACT-M (Tokyo Electron Ltd.), each of the negative resist compositions was spin-coated onto a 152-mm square mask blank having a chromium oxynitride film at the outermost surface and pre-baked on a hot plate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 120° C. for 600 seconds, and developed with a 2.38 wt % tetramethylammonium hydroxide aqueous solution, thereby yielding negative patterns.

The patterned blank was observed under a top-down scanning electron microscope (TDSEM). The optimum exposure (Eop) was defined as the exposure dose ($\mu C/cm^2$) which provided a 1:1 resolution at the top and bottom of a 200-nm 1:1 line-and-space (LS) pattern. The maximum resolution of the resist was defined as the minimum line width that could be resolved at the exposure dose providing 1:1 resolution of a 400-nm line-and-space pattern. The LER of a 200-nm line-and-space pattern was measured under SEM. The maximum resolution was also determined for a dense pattern (9:1 isolated space (IS) pattern) and a sparse pattern (1:9 isolated line (IL) pattern). On observation in cross section of the resist pattern under SEM, it was visually judged whether or not the pattern profile was rectangular. Table 7 tabulates the test results of the inventive and comparative resist compositions on EB image writing. It is noted that the optimum dose in Table 7 is the value based on the LS pattern. The LS, IL and IS patterns of the patterned blanks were evaluated for linearity (whether or not the desired line width was faithfully formed) by determining the exposure dose capable of printing a line width of 400 nm (or a space width of 400 nm in the case of IS pattern) for each pattern. Table 8 represents the fidelity to a line width of 100 nm when printed at that exposure dose.

TABLE 7

|  | Optimum dose ($\mu C/cm^2$) | Resolution of LS (nm) | Resolution of IL (nm) | Resolution of IS (nm) | LER (nm) | Pattern profile |
|---|---|---|---|---|---|---|
| Example 1 | 22 | 45 | 50 | 50 | 4.5 | rectangular |
| Example 2 | 24 | 45 | 45 | 45 | 4.4 | rectangular |
| Example 3 | 23 | 45 | 45 | 45 | 4.6 | rectangular |
| Example 4 | 23 | 45 | 45 | 45 | 4.3 | rectangular |
| Example 5 | 22 | 40 | 45 | 45 | 4.3 | rectangular |
| Example 6 | 21 | 45 | 45 | 45 | 4.3 | rectangular |
| Example 7 | 23 | 45 | 45 | 45 | 4.5 | rectangular |
| Example 8 | 22 | 45 | 45 | 45 | 4.5 | rectangular |
| Example 9 | 20 | 45 | 45 | 45 | 4.4 | rectangular |
| Example 10 | 22 | 40 | 40 | 40 | 4.5 | rectangular |
| Example 11 | 25 | 45 | 50 | 50 | 4.5 | rectangular |
| Example 12 | 26 | 45 | 50 | 50 | 4.6 | rectangular |
| Example 13 | 20 | 45 | 45 | 45 | 4.5 | rectangular |
| Example 14 | 22 | 45 | 45 | 45 | 4.6 | rectangular |
| Example 15 | 21 | 45 | 45 | 45 | 4.7 | rectangular |
| Example 16 | 26 | 45 | 50 | 50 | 4.6 | rectangular |
| Example 17 | 21 | 50 | 50 | 50 | 4.6 | rectangular |
| Example 18 | 26 | 50 | 50 | 50 | 4.7 | rectangular |
| Example 19 | 23 | 45 | 45 | 50 | 4.7 | rectangular |
| Example 20 | 23 | 45 | 45 | 45 | 4.5 | rectangular |
| Example 21 | 24 | 45 | 45 | 45 | 4.4 | rectangular |
| Example 22 | 26 | 50 | 50 | 50 | 4.7 | rectangular |
| Example 23 | 22 | 45 | 45 | 45 | 4.5 | rectangular |
| Example 24 | 23 | 45 | 45 | 45 | 4.5 | rectangular |
| Example 25 | 24 | 45 | 50 | 50 | 4.7 | rectangular |
| Comparative Example 1 | 27 | 60 | 60 | 40 | 5.5 | rectangular |
| Comparative Example 2 | 28 | 55 | 55 | 70 | 6.2 | rectangular |
| Comparative Example 3 | 28 | 70 | 70 | 50 | 6.6 | rectangular |

TABLE 8

|  | Measured width of LS (nm) | Measured width of IL (nm) | Measured width of IS (nm) |
|---|---|---|---|
| Example 2 | 102 | 102 | 99 |
| Example 3 | 102 | 102 | 101 |
| Example 4 | 101 | 102 | 101 |
| Example 5 | 101 | 102 | 102 |
| Example 6 | 102 | 102 | 101 |
| Example 7 | 102 | 102 | 101 |
| Example 8 | 103 | 102 | 102 |
| Example 10 | 102 | 103 | 100 |
| Example 18 | 103 | 103 | 101 |
| Example 19 | 102 | 103 | 99 |
| Example 20 | 102 | 103 | 102 |
| Example 21 | 103 | 102 | 101 |
| Example 24 | 103 | 103 | 102 |
| Comparative Example 1 | 106 | 104 | 93 |
| Comparative Example 2 | 102 | 103 | 94 |
| Comparative Example 3 | 103 | 106 | 94 |

As seen from Tables 7 and 8, the resist compositions within the scope of the invention are equivalent or improved in resolution and improved in LER over the resist compositions of Comparative Examples 1 to 3. The characteristic feature of the inventive resist compositions is that when a dense pattern and a sparse pattern are formed, no errors occur independent of different line width and pattern mode. The desired line width and space width can be faithfully printed within 5 nm. The chemically amplified negative resist composition is suited as ultrafine pattern-forming material for VLSI fabrication and mask pattern-forming material by EB lithography.

The invention claimed is:

1. A process for forming a resist pattern, comprising the steps of:

applying a chemically amplified negative resist composition onto a processable substrate to form a resist film having a thickness of up to 100 nanometers thereon, exposing patternwise the resist film to high-energy radiation, and developing the exposed resist film with an alkaline developer to form a resist pattern having a narrow line width of 50 nanometers or less and having a design size width variation within 5 nanometers, wherein the chemically amplified negative resist composition consists of a resist polymer consisting of the following recurring units:

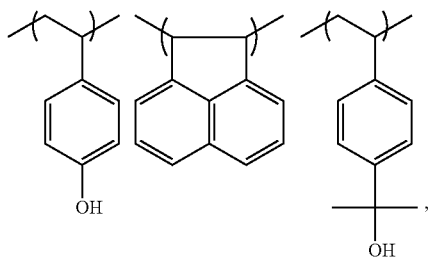

an acid generator, a basic compound, an organic solvent, and optionally a surfactant, the resist polymer becoming insoluble in alkaline developer as a result of the leaving group undergoing an elimination reaction under the catalysis of an acid generated by the acid generator upon exposure to high energy radiation.

2. The process of claim 1 wherein the high-energy radiation is EUV or electron beam.

3. The process of claim 1 wherein the processable substrate is a photomask blank.

4. The process of claim 3, wherein the photomask blank has an outermost surface formed of a chromium based material.

5. The process of claim 1, wherein the basic compound is selected from the group consisting of tris(2-(methoxymethoxy)ethyl)amine, tris(2-(methoxymethoxy)ethyl)amine-N-oxide, and an amine or amine oxide compound represented by the following formulae:

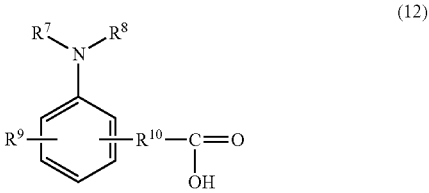

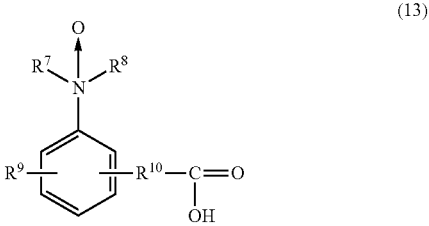

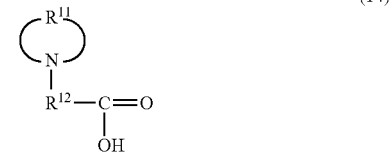

wherein $R^7$ and $R^8$ are each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, or $C_1$-$C_{10}$ alkylthioalkyl group, $R^7$ and $R^8$ may bond together to form a ring with the nitrogen atom to which they are attached, $R^9$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, $C_1$-$C_{10}$ alkylthioalkyl group, or halogen, $R^{10}$ is a single bond, a straight, branched or cyclic $C_1$-$C_{20}$ alkylene group, or $C_6$-$C_{20}$ arylene group, $R^{11}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group, $R^{12}$ is a straight, branched or cyclic $C_1$-$C_{20}$ alkylene group or $C_6$-$C_{20}$ arylene group.

* * * * *